(12) United States Patent
Makita et al.

(10) Patent No.: US 11,664,353 B2
(45) Date of Patent: May 30, 2023

(54) LIGHT EMITTING DEVICE, AND METHOD FOR MANUFACTURING LIGHT EMITTING DEVICE

(71) Applicant: TOSHIBA HOKUTO ELECTRONICS CORPORATION, Asahikawa (JP)

(72) Inventors: Kairi Makita, Asahikawa (JP); Fumio Ueno, Tokyo (JP)

(73) Assignee: NICHIA CORPORATION, Tokushima (JP)

( * ) Notice: Subject to any disclaimer, the term of this patent is extended or adjusted under 35 U.S.C. 154(b) by 269 days.

(21) Appl. No.: 16/988,938

(22) Filed: Aug. 10, 2020

(65) Prior Publication Data
US 2021/0066261 A1 Mar. 4, 2021

(30) Foreign Application Priority Data
Sep. 3, 2019 (JP) .............................. JP2019-160709

(51) Int. Cl.
*H01L 25/075* (2006.01)
*H01L 33/62* (2010.01)
(Continued)

(52) U.S. Cl.
CPC ............ *H01L 25/0753* (2013.01); *C09J 5/06* (2013.01); *C09J 9/02* (2013.01); *C09J 127/12* (2013.01); *H01L 33/483* (2013.01); *H01L 33/62* (2013.01); *H01R 4/04* (2013.01); *H01R 12/61* (2013.01); *H01R 43/00* (2013.01); *C08K 7/18* (2013.01); *C08K 9/10* (2013.01); *C08K 2201/001* (2013.01); *C08K 2201/013* (2013.01); *H01L 33/56* (2013.01); *H01R 4/70* (2013.01)

(58) Field of Classification Search
CPC combination set(s) only.
See application file for complete search history.

(56) References Cited

U.S. PATENT DOCUMENTS 10,461,063 B2    10/2019  Maki
2001/0024460 A1   9/2001  Yamamoto et al.
(Continued)

FOREIGN PATENT DOCUMENTS

JP    6431485 B2    11/2018

OTHER PUBLICATIONS

U.S. Appl. No. 16/713,256, filed Dec. 13, 2019, Naoki Takojima.
U.S. Notice of Allowance, U.S. Appl. No. 17/452,433, dated Nov. 25, 2022 (10 pages).

*Primary Examiner* — Mark W Tornow
*Assistant Examiner* — Priya M Rampersaud
(74) *Attorney, Agent, or Firm* — Burr Patent Law, PLLC

(57) ABSTRACT

A light-emitting device according to an embodiment is provided with: a light-emitting panel including a first board that is light transmissive and flexible, a plurality of conductor patterns formed on a surface of the first board, a plurality of light-emitting elements connected to one of the conductor patterns, and a second board that is light transmissive and flexible and that holds the light-emitting elements relative to the first board; and a flexible wiring board including a circuit pattern that is electrically connected via an anisotropic conductive layer to an exposed part of the conductor patterns formed on the first board, the exposed part being exposed by the end of the second board.

7 Claims, 33 Drawing Sheets

(51) Int. Cl.
*H01R 12/61* (2011.01)
*H01R 4/04* (2006.01)
*H01R 43/00* (2006.01)
*C09J 9/02* (2006.01)
*C09J 5/06* (2006.01)
*H01L 33/48* (2010.01)
*C09J 127/12* (2006.01)
*H01L 33/56* (2010.01)
*H01R 4/70* (2006.01)
*C08K 9/10* (2006.01)
*C08K 7/18* (2006.01)

(56) References Cited

U.S. PATENT DOCUMENTS

| | | | |
|---|---|---|---|
| 2011/0284822 A1 | 11/2011 | Jung et al. | |
| 2016/0276321 A1* | 9/2016 | Maki | H01L 33/56 |
| 2020/0013763 A1 | 1/2020 | Maki | |
| 2020/0072448 A1* | 3/2020 | Matsushita | F21S 43/15 |
| 2020/0075558 A1* | 3/2020 | Jingi | H01L 33/62 |
| 2020/0279983 A1* | 9/2020 | Takojima | H01L 33/62 |

\* cited by examiner

FIG.19

| | Laminated Material | Curing Shrinkage Rate (%) | Temp (°C) | Pressurizing Force (MPa) | Time (sec) | Curvature Ratio e/f | Contact Resistance (mΩ) | Pre-PCT Cross-Section Photograph | Post-PCT Cross-Section Photograph | Presence of Peeling After PCT |
|---|---|---|---|---|---|---|---|---|---|---|
| EX1 | A | 18 | 170 | 0.5 | 30 | 0.96 | 41.1 | FIG.29A | FIG.30A | No |
| EX2 | A | 18 | 170 | 1.0 | 30 | 0.7 | 11.9 | FIG.29B | FIG.30B | Yes |
| EX3 | A | 18 | 170 | 2.0 | 30 | 0.6 | 9.7 | FIG.29C | FIG.30C | Yes |
| EX4 | A | 18 | 170 | 3.0 | 30 | 0.5 | 8.6 | FIG.29D | FIG.30D | Yes |
| EX5 | B | 7 | 175 | 0.5 | 30 | 0.97 | 35.6 | FIG.29E | FIG.30E | No |
| EX6 | B | 7 | 175 | 1.0 | 30 | 0.88 | 12.8 | FIG.29F | FIG.30F | No |
| EX7 | B | 7 | 175 | 2.0 | 30 | 0.85 | 9.9 | FIG.29G | FIG.30G | No |
| EX8 | B | 7 | 175 | 3.0 | 30 | 0.8 | 8.8 | FIG.29H | FIG.30H | No |

FIG.20

| | Laminated Material | Curing Shrinkage Rate (%) | Temp (°C) | Pressurizing Force (MPa) | Time (sec) | Pre-PCT Gap (μm) | Post-PCT Gap (μm) | Pre-PCT Contact Resistance (mΩ) | Post-PCT Contact Resistance (mΩ) | Pre-PCT Cross-Section Photograph | Post-PCT Cross-Section Photograph |
|---|---|---|---|---|---|---|---|---|---|---|---|
| EX1 | A | 18 | 170 | 0.5 | 30 | 2.71 | 1.25 | 43.19 | 148.78 | FIG.31A | FIG.32A |
| EX2 | A | 18 | 170 | 1.0 | 30 | 1.25 | 1.6 | 13.31 | 16.11 | FIG.31B | FIG.32B |
| EX3 | A | 18 | 170 | 2.0 | 30 | 0.64 | 0.75 | 8.3 | 27.31 | FIG.31C | FIG.32C |
| EX4 | A | 18 | 170 | 3.0 | 30 | 0.4 | 4 | 7.14 | 440.60 | FIG.31D | FIG.32D |
| EX5 | B | 7 | 175 | 0.5 | 30 | 2.89 | 3.05 | 35.93 | 134.80 | FIG.31E | FIG.32E |
| EX6 | B | 7 | 175 | 1.0 | 30 | 1.15 | 1.60 | 14.14 | 25.48 | FIG.31F | FIG.32F |
| EX7 | B | 7 | 175 | 2.0 | 30 | 0.5 | 0.61 | 9.74 | 11.37 | FIG.31G | FIG.32G |
| EX8 | B | 7 | 175 | 3.0 | 30 | 0.3 | 0.8 | 9.12 | 11.86 | FIG.31H | FIG.32H |

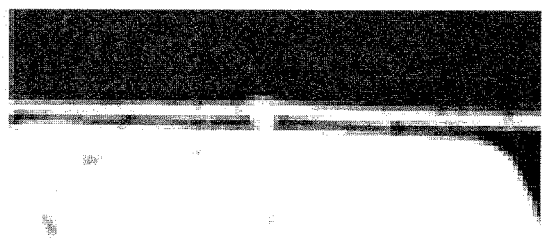
FIG.31E
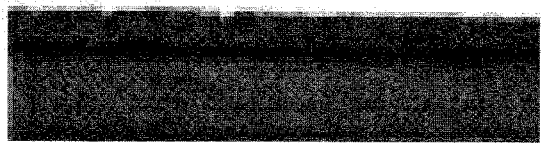
FIG.31F
FIG.31G
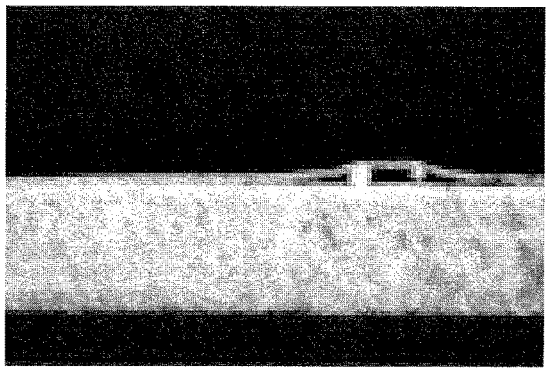
FIG.31H
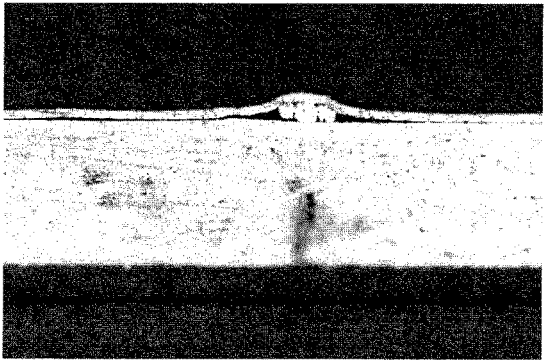

LIGHT EMITTING DEVICE, AND METHOD FOR MANUFACTURING LIGHT EMITTING DEVICE

CROSS-REFERENCE TO RELATED APPLICATIONS

This application is based upon and claims the benefit of priority from the prior Japanese Patent Application No. 2019-160709 filed in Japan on Sep. 3, 2019; the entire contents of which are incorporated herein by reference.

FIELD

Embodiments of the present invention relate to a light-emitting device and a method for manufacturing a light-emitting device.

BACKGROUND

A light-emitting device that is flexible, and that is constituted by connecting, by means of an anisotropic conductive adhesive, a light-emitting panel and an external wiring to be connected to the light-emitting panel has been disclosed.

In order to operate the light-emitting device, it is necessary to electrically connect to the light-emitting panel an external power source, or an electrical wire of some other external device (hereinafter referred to as "external device, etc."). However, the light-emitting panel constituting the light-emitting device is flexible, and a conductor pattern of the light-emitting panel is extremely thin. It is difficult to directly connect an external device, etc. to such a conductor pattern. Thus, it is necessary to connect a flexible wiring board, which is flexible and has a circuit pattern, as an external wiring to the conductor pattern of the light-emitting panel.

BRIEF DESCRIPTION OF THE DRAWINGS

FIG. 19 shows example test results.

FIG. 20 shows example test results.

FIG. 31E is a photograph of a cross-section of the connection part of the light-emitting device according to Example 5.

FIG. 31F is a photograph of a cross-section of the connection part of the light-emitting device according to Example 6.

FIG. 31G is a photograph of a cross-section of the connection part of the light-emitting device according to Example 7.

FIG. 31H is a photograph of a cross-section of the connection part of the light-emitting device according to Example 8.

DETAILED DESCRIPTION

A light-emitting device according to an embodiment of the present invention is provided with the following: a light-emitting panel including a first board that is light transmissive and flexible, a plurality of conductor patterns formed on a surface of the first board, a plurality of light-emitting elements connected to one of the conductor patterns, and a second board that is light transmissive and flexible and that holds the light-emitting elements relative to the first board; and a flexible wiring board having a circuit pattern that is electrically connected via an anisotropic conductive layer to exposed parts of the conductor patterns formed on the first board, the exposed parts being exposed by the end of the second board.

In the following, one embodiment of the present invention shall be explained with reference to the drawings. An XYZ coordinate system consisting of an X-axis, a Y-axis, and a Z-axis which are mutually orthogonal shall be used for the explanation.

<Configuration of Light-Emitting Device>

Figure 1:
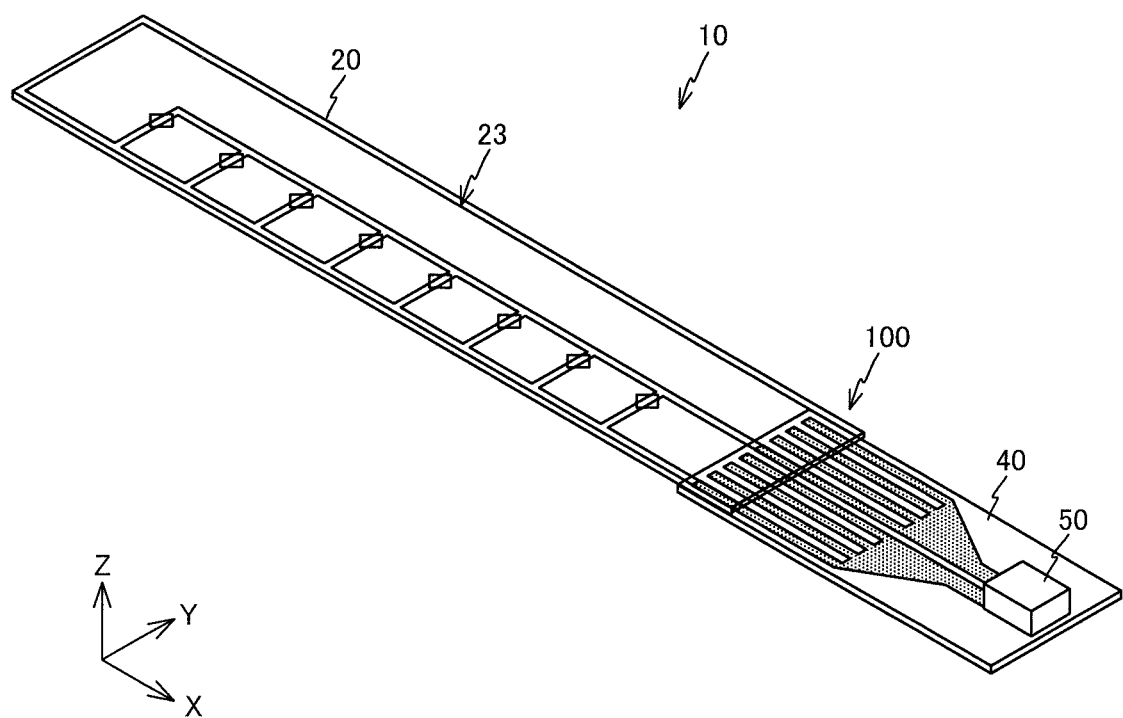
FIG. 1 is a schematic view of a light-emitting device according to an embodiment.
Figure 2:
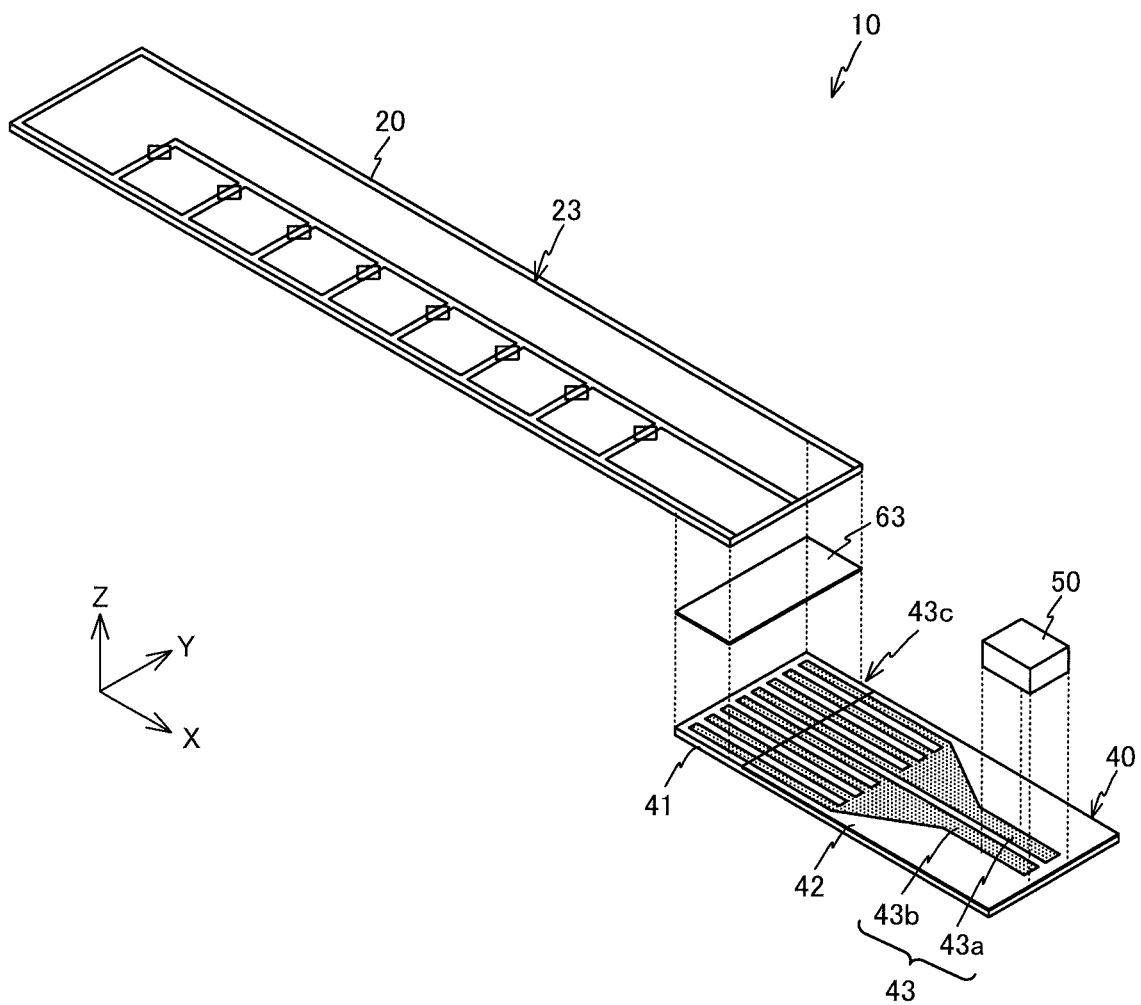
FIG. 2 is a developed schematic view of the light-emitting device according to this embodiment.

FIG. 1 is a schematic view illustrating one example of a light-emitting device 10 according to the present embodiment. FIG. 2 is a developed schematic view of the light-emitting device 10. The light-emitting device 10 is provided with a light-emitting panel 20, a flexible wiring board 40 connected to the light-emitting panel 20, and a connector 50 mounted to the flexible wiring board 40. The light-emitting device 10 is connected via the connector 50 to an external power source or some other external device, etc. A conductor layer 23 of the light-emitting panel 20 and a wiring board conductor layer 43 of the flexible wiring board 40 are electrically and mechanically connected by an anisotropic conductive layer 63.

<Explanation of Light-Emitting Panel>

Figure 3:
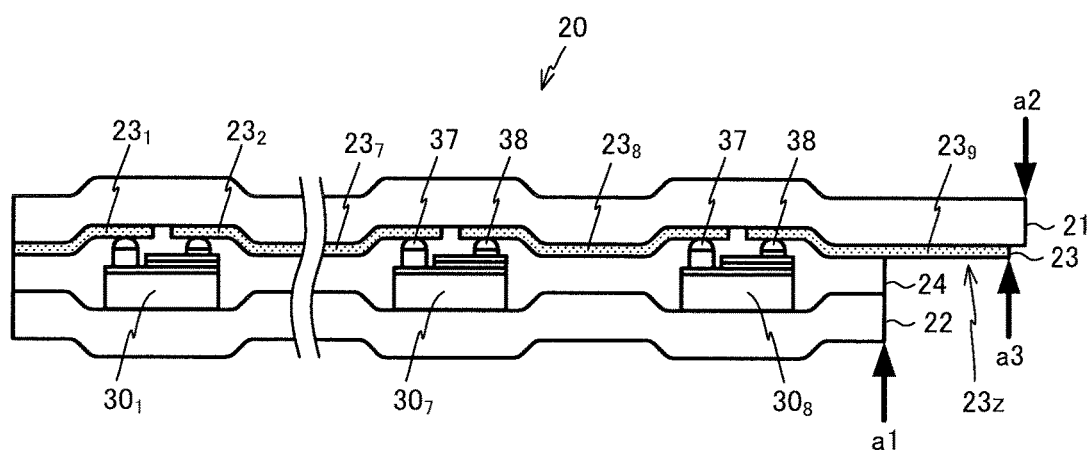
FIG. 3 is a cross-section view of a light-emitting panel.
Figure 3:
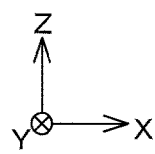

FIG. 3 is a side view of the light-emitting panel 20. As shown in FIG. 3, the light-emitting panel 20 includes a first set of boards 21, 22, an intermediate resin layer 24 formed between the boards 21, 22, and a plurality (for example, eight) of light-emitting elements $30_1$-$30_8$ disposed within the intermediate resin layer 24.

The board 21 is a film-shaped insulative member having a thickness of 50-300 μm, and in this embodiment, a PET film having a thickness of 100 μm is used. The boards 21, 22 are transmissive with respect to visible light. The total light transmittance of the boards 21, 22 is at least 5% and no more than 95%. Total light transmittance indicates the total light transmittance as measured based on Japanese Industrial Standard JISK7375:2008.

The boards 21, 22 are flexible, and the bending elastic modulus thereof is 0.1-320 kgf/mm². Bending elastic modulus is a value measured by a method based on JISK7171:2016.

As the material of the boards 21, 22, polyethylene terephthalate (PET), polyethylene naphthalate (PEN), polycarbonate (PC), polyethylene succinate (PES), cyclic olefin-based resin, acrylic resin, polyimide, etc. may be used.

On the inner surface of the board 21 among the set of boards 21, 22, the conductor layer 23 having a thickness of 0.05-4 μm is formed.

The intermediate resin layer 24 is an insulator formed between the board 21 and the board 22. The intermediate resin layer 24 has a thickness of 50-200 μm, and consists of an epoxy-based thermosetting resin or a polyimide-based thermosetting resin, etc. The total light transmittance of the intermediate resin layer 24 is at least 5% and no more than 95%, and the intermediate resin layer 24 is constituted by a material in which a thermosetting resin is the main component. The material that constitutes the intermediate resin layer 24 may include another resin component, etc. as necessary. As the thermosetting resin, an epoxy-based resin, an acrylic-based resin, a styrene-based resin, an ester-based resin, a urethane-based resin, a melamine resin, a phenol resin, an unsaturated polyester resin, a diallyl phthalate resin, polyimide, etc. may be used.

The intermediate resin layer 24 may be constituted from a resin in which a thermoplastic resin is the main component. As the thermoplastic resin, a polypropylene resin, a polyethylene resin, a polyvinyl chloride resin, an acrylic resin, a Teflon resin, a polycarbonate resin, an acrylonitrile-butadiene-styrene resin, a polyamide-imide resin, etc. may be used.

With regard to the intermediate resin layer 24 according to the present embodiment, further details thereof are also disclosed in United States Patent Application, Publication No. US 2016/0155913 (WO 2014/156159), the contents of which are incorporated herein by reference. In addition, with regard to the properties such as the mechanical loss tangent of the intermediate resin layer 24, further details thereof are also disclosed in Japanese Patent Application No. 2018-164946, the contents of which are incorporated herein by reference.

The end on the +X side of the board 22 is indicated as position a1, the end on the +X side of the board 21 is indicated as position a2, and the end on the +X side of the conductor layer 23 is indicated as position a3. In the light-emitting device 10, the board 22 is shorter in length in the X-axis direction than the board 21. Therefore, the conductor layer 23 is in an exposed state from position a1 to position a3.

Figure 4:
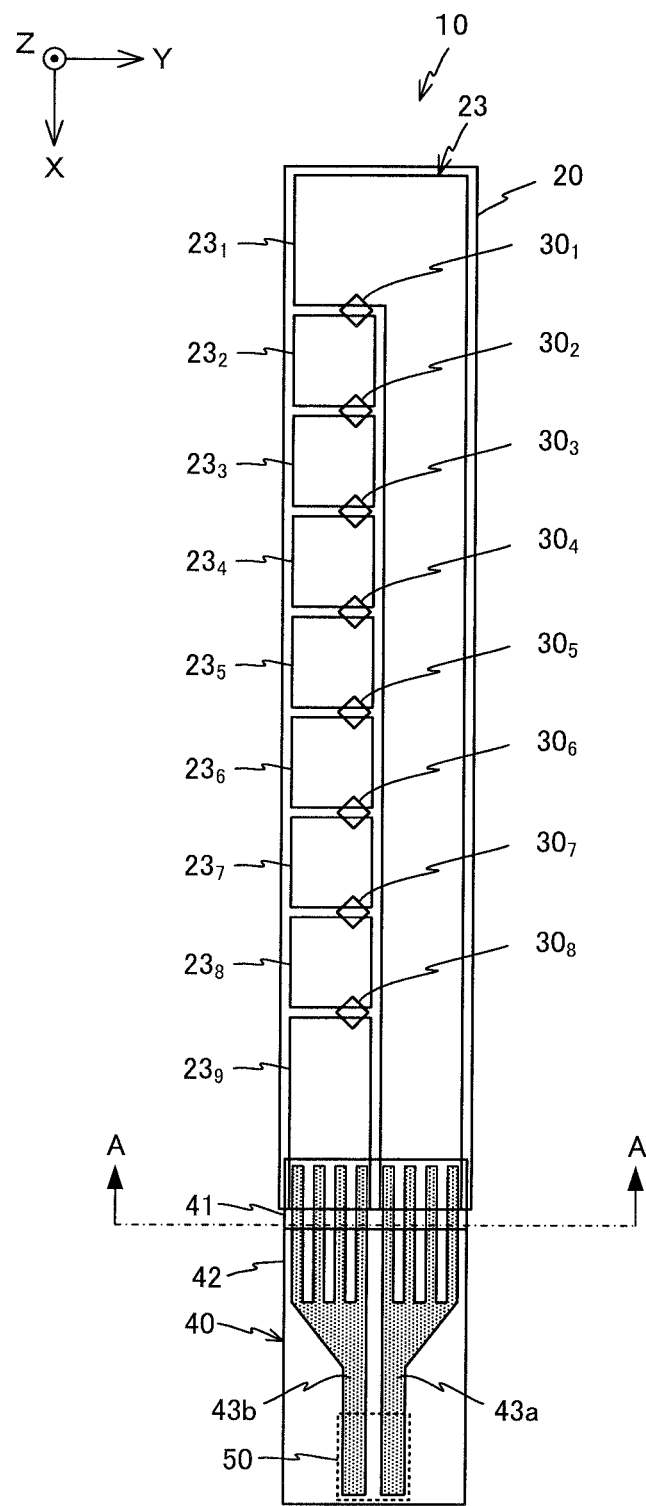
FIG. 4 is a plan view of the light-emitting device.

FIG. 4 is a plan view of the light-emitting device 10. As can be understood upon referring to FIG. 4, the conductor layer 23 consists of an L-shaped conductor pattern $23_1$ formed along the outer edge on the +Y side of the board 21, and a plurality of quadrilateral conductor patterns $23_2$-$23_9$ arranged along the outer edge on the −Y side of the board 21. The conductor patterns $23_1$-$23_9$ are made of a metallic material such as copper (Cu) or silver (Ag), or a transparent conductive film such as ITO. In the light-emitting device 10, the distance between the conductor patterns $23_1$-$23_9$ is at least 500 μm or less, normally 100 μm or less.

For example, the conductor patterns $23_1$-$23_9$ are in a mesh pattern constituted by a plurality of mutually orthogonal line patterns made of copper (Cu). The line width of the line patterns is from 1 μm to 20 μm, and is 5 μm in the present example. The arrangement pitch of the line patterns is from 100 μm to 250 μm, and is 150 μm in the present example.

The conductor layer 23 is not limited to a mesh pattern, and may be a stripe pattern or a honeycomb pattern, and also may be an inorganic or organic transparent conductor film of ITO, zinc oxide, or tin oxide, etc. The total light transmittance of the conductor layer 23 is at least 5% and no more than 95%, and the sheet resistance thereof is 100 Ω/sq or less.

With regard to the conductor patterns constituting the conductor layer 23, further details thereof are disclosed in United States Patent Application, Publication No. US 2016/0276322 (WO 2015/083366), the contents of which are incorporated herein by reference.

Figure 5:
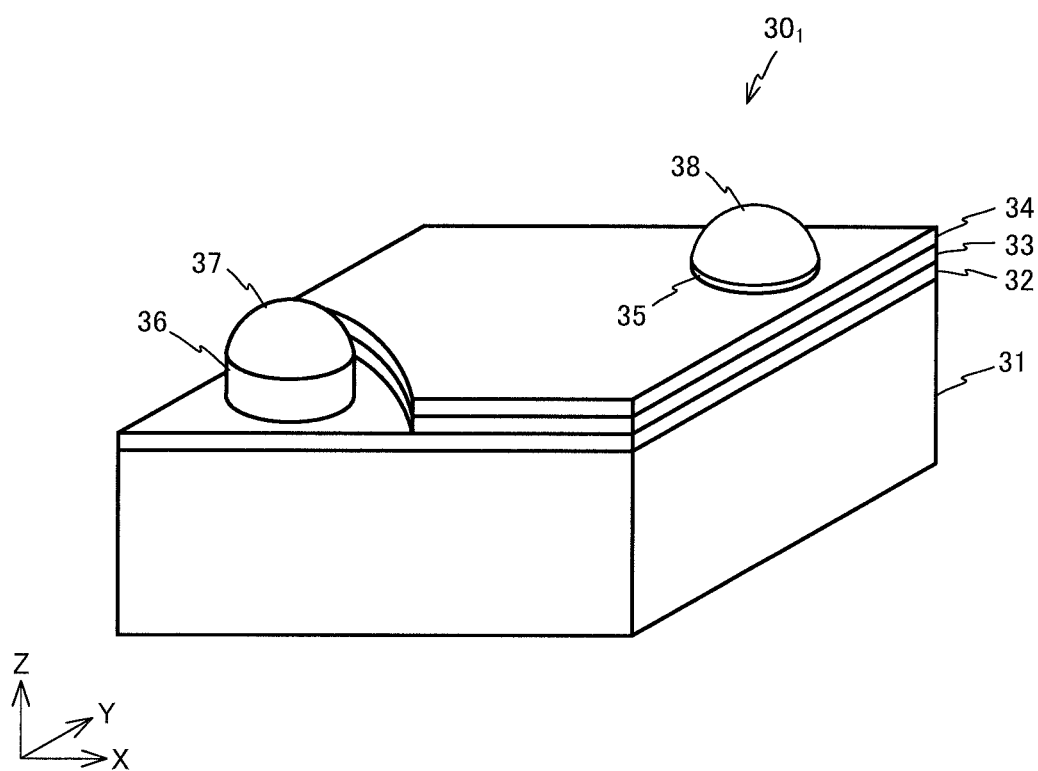
FIG. 5 is a schematic view of a light-emitting element.

The light-emitting elements 30 are LED chips. As shown in FIG. 5, each light-emitting element 30 is an LED chip with a four-layer structure consisting of a base board 31, an N-type semiconductor layer 32, an active layer 33, and a P-type semiconductor layer 34.

The base board 31 is a semiconductor substrate made of GaAs, Si, GaP, etc. The N-type semiconductor layer 32 is formed with the same shape as the base board 31 on the top surface of the base board 31. The active layer 33 and the P-type semiconductor layer 34 are laminated, in order, on the top surface of the N-type semiconductor layer 32. The active layer 33 and the P-type semiconductor layer 34 which are laminated on the N-type semiconductor layer 32 are cut away at a corner portion at the −Y side and the −X side, and the surface of the N-type semiconductor layer 32 is exposed from this cut away portion. The positions of the N-type semiconductor layer and the P-type semiconductor layer may be reversed.

An electrode 36, which is electrically connected to the N-type semiconductor layer 32, is formed on a portion of the N-type semiconductor layer 32 that is exposed from the active layer 33 and the P-type semiconductor layer 34. An electrode 35, which is electrically connected to the P-type semiconductor layer 34, is formed at a corner portion on the +X side and the +Y side of the P-type semiconductor layer 34. The electrodes 35, 36 are made of good conductors such as copper (Cu) or gold (Au), and bumps 37, 38 are formed on the top surfaces thereof. The bumps 37, 38 are made of solder, and are formed in a semispherical shape. Metallic bumps of gold (Au) or gold alloy, etc. may be used instead of the solder bumps. In the light-emitting element 30, the bump 37 functions as a cathode electrode, and the bump 38 functions as an anode electrode.

With regard to the bumps 37, 38 provided to the light-emitting element 30, further details thereof are disclosed in United States Patent Application, Publication No. US 2016/0276561 (WO 2015/083365), the contents of which are incorporated herein by reference. In addition, with regard to the electrical connection between the bumps 37, 38 and the conductor layer 23 in the light-emitting device, further details thereof are also disclosed in Japanese Patent Application No. 2018-16165, the contents of which are incorporated herein by reference.

Figure 6:
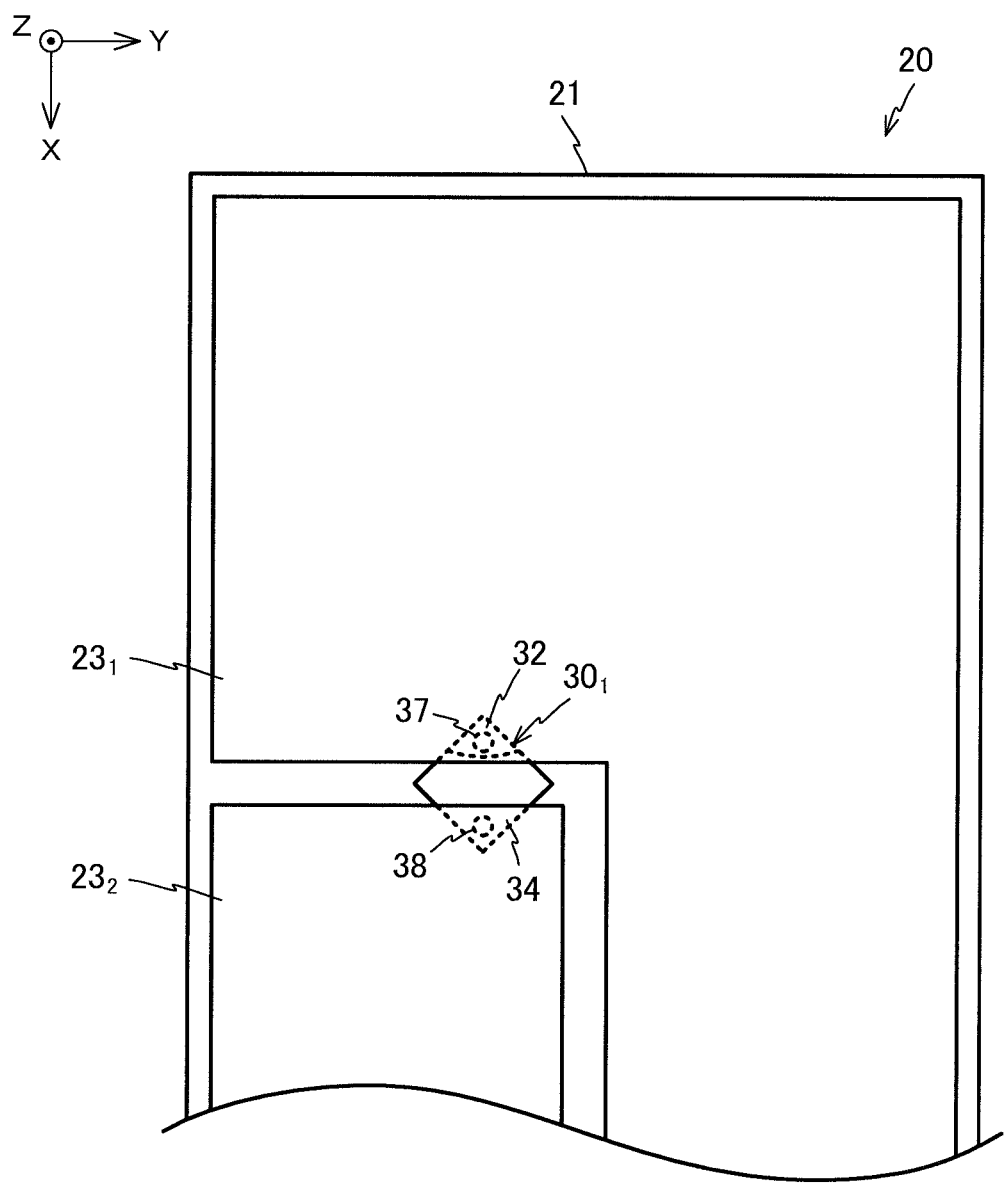
FIG. 6 is a view showing the light-emitting element connected to a conductor pattern.

As shown in FIG. 6, the light-emitting element $30_1$ configured as described above is, for example, disposed between the conductor patterns $23_1$ and $23_2$, and the bump 37 is connected to the conductor pattern $23_1$ while the bump 38 is connected to the conductor pattern $23_2$. The N-type semiconductor layer 32 of the light-emitting element $30_1$ opposes only the conductor pattern $23_1$ to which the bump 37 is connected, and the P-type semiconductor layer 34 of the light-emitting element $30_1$ opposes both the conductor pattern $23_1$ to which the bump 37 is connected and the conductor pattern $23_2$ to which the bump 38 is connected.

The other light-emitting elements $30_2$-$30_8$ have the same configuration as that of the light-emitting element $30_1$. The light-emitting element $30_2$ is disposed between the conductor patterns $23_2$ and $23_3$, and the bumps 37 and 38 are connected to the conductor patterns $23_2$ and $23_3$, respectively.

Similarly, the light-emitting element $30_3$ is disposed across the conductor patterns $23_3$ and $23_4$, the light-emitting element $30_4$ is disposed across the conductor patterns $23_4$ and $23_5$, the light-emitting element $30_5$ is disposed across the conductor patterns $23_5$ and $23_6$, the light-emitting element $30_6$ is disposed across the conductor patterns $23_6$ and $23_7$, the light-emitting element $30_7$ is disposed across the conductor patterns $23_7$ and $23_8$, and the light-emitting element $30_8$ is disposed across the conductor patterns $23_8$ and $23_9$. Due to this configuration, the conductor patterns $23_1$-$23_9$ and the light-emitting elements 30 are connected in series. In the light-emitting panel 20, the light-emitting elements 30 are disposed at intervals of from 0.5 mm to 20 mm. The light-emitting elements $30_1$-$30_8$ shown in FIG. 3 are disposed at 10 mm intervals.

<Explanation of Flexible Wiring Board>

Figure 7:
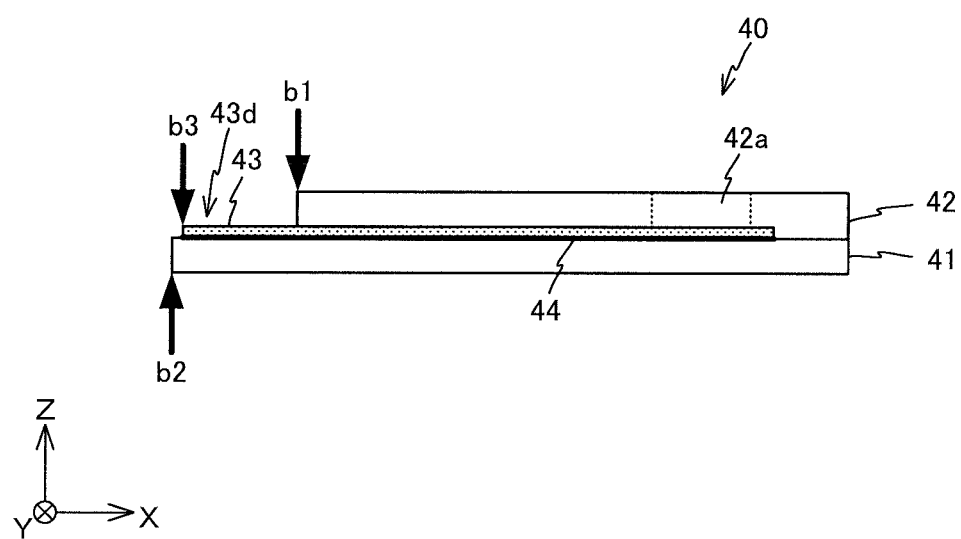
FIG. 7 is a side view of a flexible wiring board.

FIG. 7 is a side view of the flexible wiring board 40. As shown in FIG. 7, the X-axis direction length of a coverlay 42 of the flexible wiring board 40 is shorter than that of a substrate 41. Therefore, the wiring board conductor layer 43 is in an exposed state from a position b3 at the −X side end of the wiring board conductor layer 43 to a position b1 at the −X side end of the coverlay 42.

With regard to the flexible wiring board 40, further details thereof are disclosed in United States Patent Application, Publication No. US 2016/0276321 (WO 2015/083364), the contents of which are incorporated herein by reference.

The flexible wiring board 40 has a thickness of from 30 µm to 140 µm, typically from 60 µm to 100 µm. The flexible wiring board 40 is composed of the substrate 41 which is insulative and serves as a base, the wiring board conductor layer 43 which is formed on the top surface of the substrate 41, and the coverlay 42 which is insulative and covers the wiring board conductor layer 43.

The substrate 41 is made of polyimide or polyester, etc., and on the top surface thereof, the wiring board conductor layer 43 is formed with an adhesive material layer 44 therebetween. The wiring board conductor layer 43 is made of a metallic foil such as copper foil or silver foil, and is formed by adhering a patterned metallic foil to the top surface of the substrate 41. In the present embodiment, the wiring board conductor layer 43 consists of two circuit patterns 43a, 43b.

The circuit patterns 43a, 43b are formed from the −X side end to the +X side end of the substrate 41. As shown in FIG. 2, the circuit patterns 43a, 43b branch into multiple circuit patterns at the −X side end thereof so as to form a conductive comb-shaped exposed part 43c. The +X side ends of the circuit patterns 43a, 43b have a tapered shape in which the width narrows toward the +X direction.

The wiring board conductor layer 43 formed on the top surface of the substrate 41 is covered by the coverlay 42 which has been vacuum thermocompression bonded. An opening 42a is formed in the coverlay 42, and the connector 50 is electrically connected via the opening 42a to the wiring board conductor layer 43 or to the circuit patterns 43a, 43b. There are cases in which a single opening 42a or multiple openings 42a are provided to the flexible wiring board, and there are also cases in which mutually different circuit patterns constituting the wiring board conductor layer 43 are respectively connected to different connectors 50.

<Connection Part of Light-Emitting Panel and Flexible Wiring Board; Anisotropic Conductive Layer>

Figure 8:
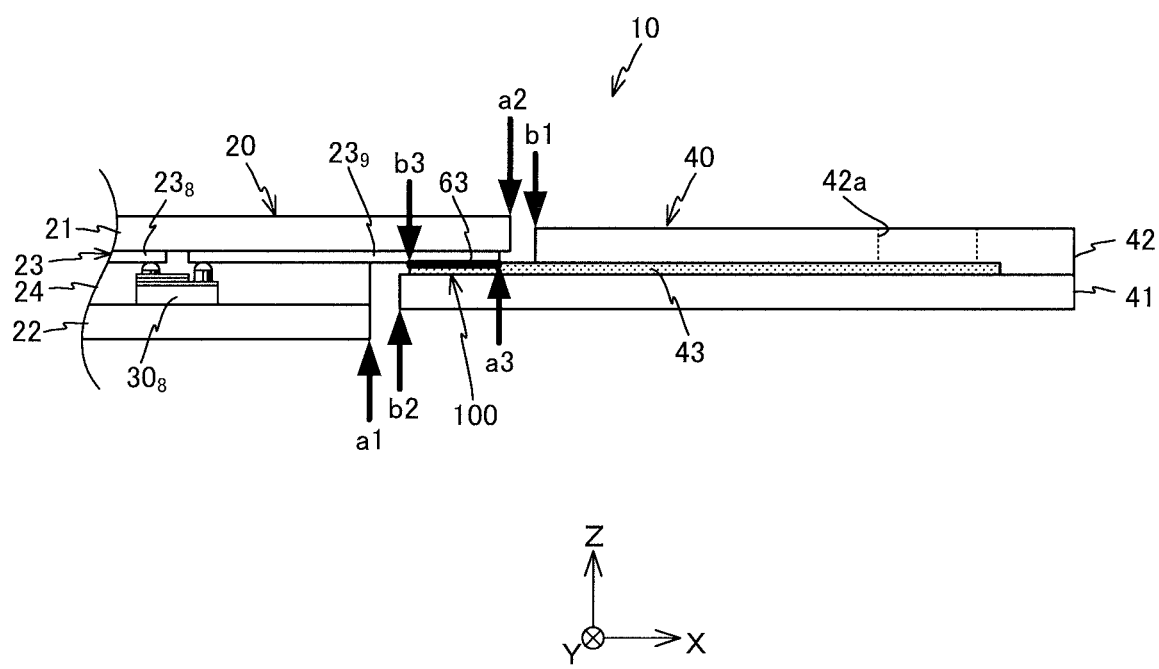
FIG. 8 is a view showing a connection part between the light-emitting panel and the flexible wiring board.

As shown in FIG. 8, the flexible wiring board 40 is adhered to the light-emitting panel 20 in a state in which the wiring board conductor layer 43 that is exposed from the coverlay 42 is in contact with the +X side end of the conductor layer 23 of the light-emitting panel 20. The electrical connection between the wiring board conductor layer 43 and the conductor layer 23 is realized by an anisotropic conductive film 630 which serves as the anisotropic conductive layer 63.

Figure 9:
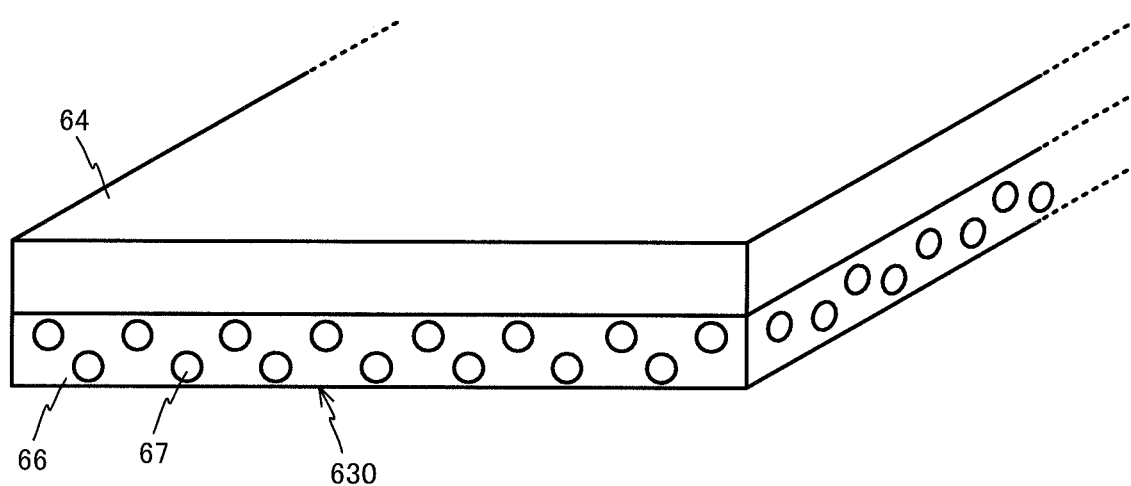
FIG. 9 is a schematic view of an anisotropic conductive film.

FIG. 9 is a schematic view showing the anisotropic conductive film 630 together with a separator 64. As the anisotropic conductive film 630, an anisotropic conductive film obtained by mixing Ni particles with an average diameter of 5 µm, which serve as conductive particles 67, into a thermosetting adhesive material layer 66 having a film thickness of 25 µm can be used. As the adhesive material layer 66, a resin composition in which a thermosetting resin is the main component, a resin composition in which a thermoplastic resin is the main component, or a hot-melt resin can be used. The adhesive material layer 66 is made of, for example, a fluororesin. Further, as the adhesive material layer 66, an epoxy-based resin, an acrylic-based resin, a styrene-based resin, an ester-based resin, a urethane-based resin, a melamine resin, a phenol resin, an unsaturated polyester resin, a diallyl phthalate resin, polyimide, etc. can also be used.

The thickness of the adhesive material layer 66 of the anisotropic conductive film 630 is from 2 µm to 50 µm, preferably from 25 µm to 45 µm. As the conductive particles 67, resin particles plated on the surface thereof with Ni, Au, or Ni/Au, or metallic particles of Ni, etc. may be used. The average diameter of the conductive particles 67 is 2-10 µm, more preferably 4-8 µm.

The separator 64 is attached to the anisotropic conductive film 630 before use. The separator 64 is a film-shaped member that holds the adhesive material layer 66. The separator 64 is peeled off and removed from the anisotropic conductive film 630 after the anisotropic conductive film 630 has been adhered to the flexible wiring board 40.

Instead of using the anisotropic conductive film 630, the wiring board conductor layer 43 and the conductor layer 23 may be adhered to each other using an anisotropic conductive paste or an anisotropic conductive ink. The anisotropic conductive paste or anisotropic conductive ink can be applied to or installed on a connection part between the wiring board conductor layer 43 and the conductor layer 23 by means of printing or ink jet, etc.

With regard to the anisotropic conductive film 630 and the anisotropic conductive adhesive, further details thereof are disclosed in United States Patent Application, Publication No. US 2016/0276321 (WO 2015/083364), the contents of which are incorporated herein by reference.

<Mounting of Connector>

When the connector 50 is mounted on the flexible wiring board 40, the pair of terminals of the connector 50 are connected respectively, via the opening 42a provided to the coverlay 42, to the circuit patterns 43a, 43b that constitute the wiring board conductor layer 43 of the flexible wiring board 40.

<Method for Connecting Light-Emitting Panel and Flexible Wiring Board>

Next, the procedure for connecting the light-emitting panel 20 and the flexible wiring board 40 of the light-emitting device 10 shall be explained.

Figure 10:
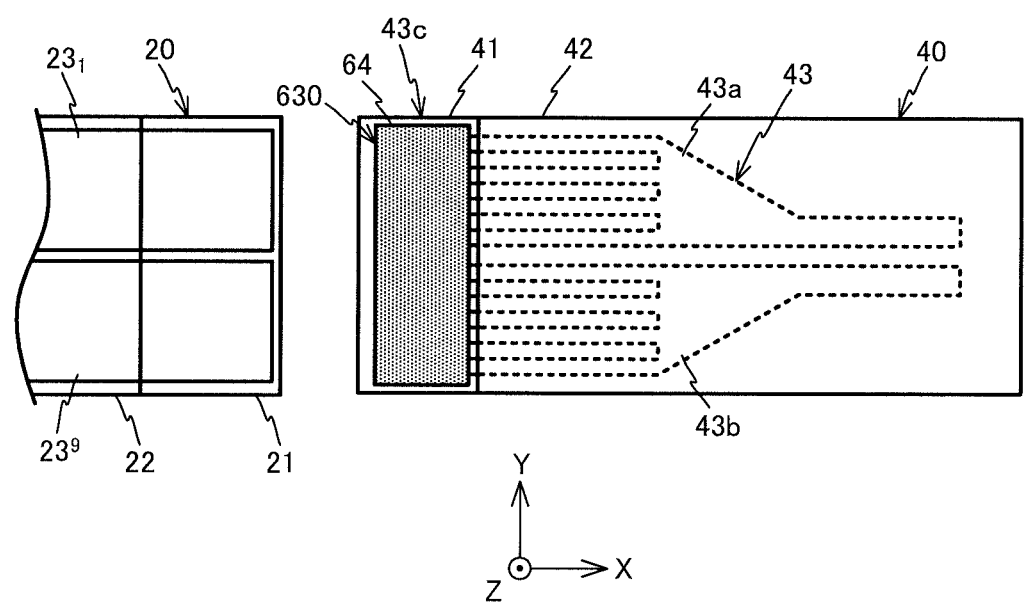
FIG. 10 is a diagram for explaining a method for manufacturing the light-emitting device.

First, as shown in FIG. 10, the anisotropic conductive film 630 in a state in which the separator 64 has been attached thereto is disposed on the ends of the circuit patterns 43a, 43b which are exposed from the −X side end of the substrate 41 that constitutes the flexible wiring board 40. The anisotropic conductive film 630 is disposed from position b1 to position b3 of the light-emitting panel 20 shown in FIG. 7.

Figure 11:
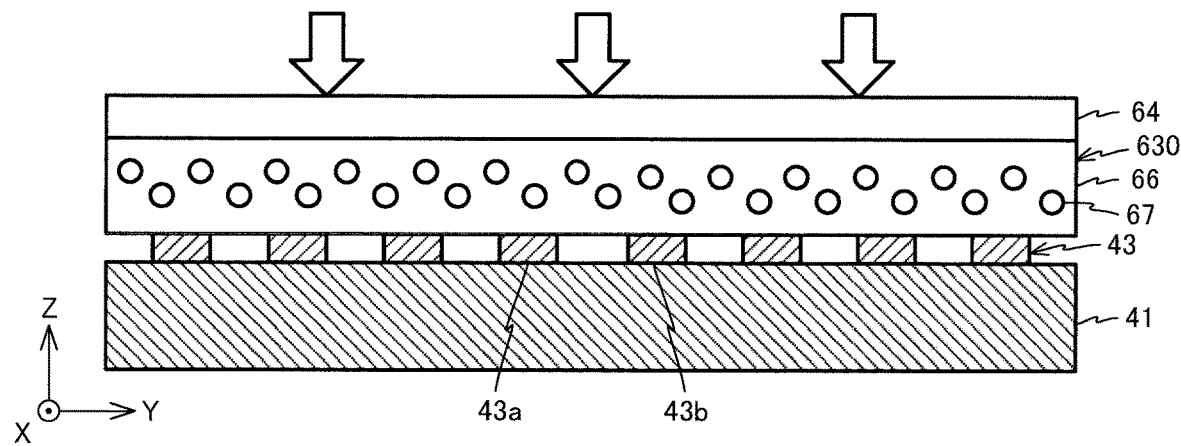
FIG. 11 is a diagram for explaining the method for manufacturing the light-emitting device.

FIG. 11 shows a cross-section along line A-A of FIG. 4. When the anisotropic conductive film 630 is disposed on the ends of the circuit patterns 43a, 43b, the anisotropic conductive film 630 is adhered to the circuit patterns 43a, 43b by thermocompression bonding for 15 to 30 seconds at a temperature of from 160° C. to 180° C. and a pressurizing force of from 1.5 MPa to 3 MPa. Thereby, the anisotropic conductive film 630 is adhered to the portion from position b1 to position b3 of the board 21 shown in FIG. 7.

Figure 12:
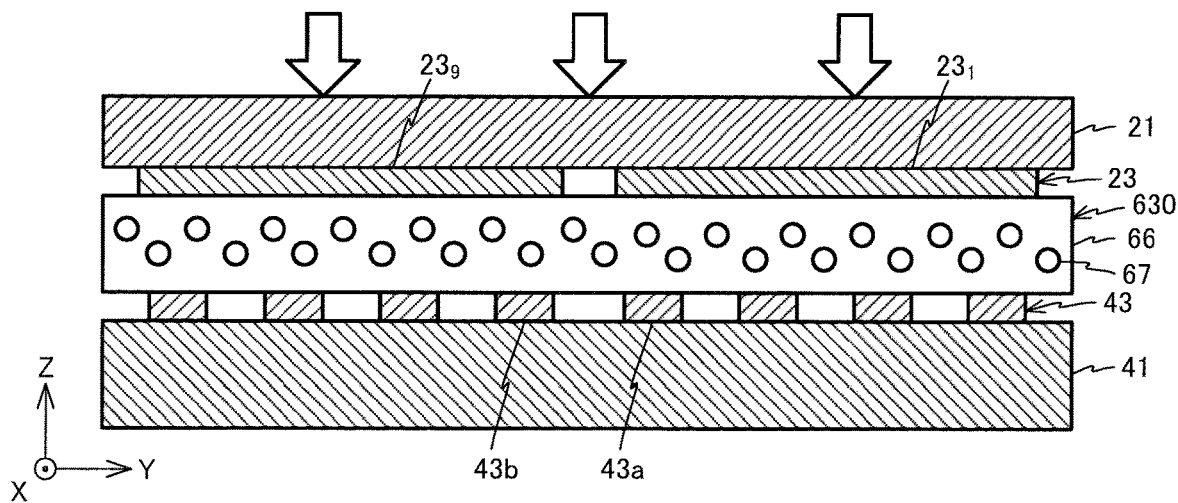
FIG. 12 is a diagram for explaining the method for manufacturing the light-emitting device.
Figure 13:
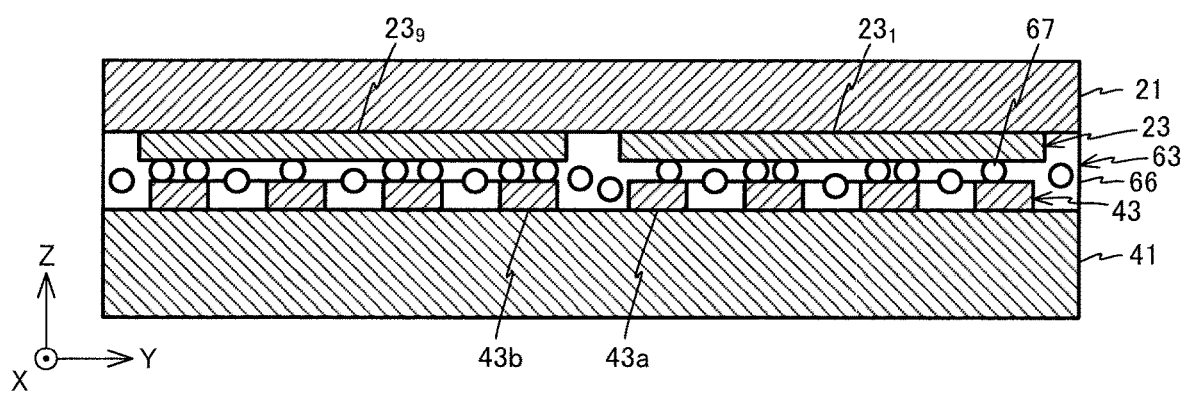
FIG. 13 is a diagram for explaining the method for manufacturing the light-emitting device.

Next, the separator 64 is peeled off and removed, and then as shown in FIG. 12, the board 21 which constitutes the light-emitting panel 20 is overlaid onto the anisotropic conductive film 630. When overlaying the board 21, the exposed part from position a1 to position a3 of FIG. 3 is positioned onto the anisotropic conductive film 630. Then thermocompression bonding is performed for 15 to 30 seconds at a temperature of from 160° C. to 180° C. and a pressurizing force of from 1.5 MPa to 3 MPa. Thereby, the anisotropic conductive film 630 becomes the anisotropic conductive layer 63 which is integral with the light-emitting panel 20 and the flexible wiring board 40 as shown in FIG. 13, and the board 21 and the substrate 41 are mechanically connected by the adhesive material which constitutes the adhesive material layer 66. Further, the conductor patterns 23$_1$, 23$_9$ of the board 21 and the circuit patterns 43$a$, 43$b$ of the substrate 41 are electrically connected by the conductive particles 67 and are mechanically connected by the adhesive material layer 66. In this way, the light-emitting panel 20 and the flexible wiring board 40 are electrically and mechanically connected.

When adhering the light-emitting panel 20 and the flexible wiring board 40, the anisotropic conductive film 630 may first be thermocompression bonded to the portion from position a1 to position a2 of the light-emitting panel 20, and then thermocompression bonded to the portion from position b1 to position b2 of the flexible wiring board 40. The anisotropic conductive film 630 is disposed across the conductor patterns 23$_1$, 23$_9$.

<Mechanical/Environmentally-Resistant Protection of Connection Part>

As shown in FIG. 8, the conductor layer 23 and the wiring board conductor layer 43 are in an exposed state in a connection part 100 of the light-emitting panel 20 and the flexible wiring board 40, specifically the portion from position a1 to position b1. Further, in the connection part 100, the light-emitting panel 20 and the flexible wiring board 40 are electrically and mechanically connected by only the anisotropic conductive layer 63. Therefore, when using the light-emitting device 10 under severe conditions such as installing the light-emitting device 10 in a vehicle, the connection reliability of the connection part 100 is poor.

Figure 14:
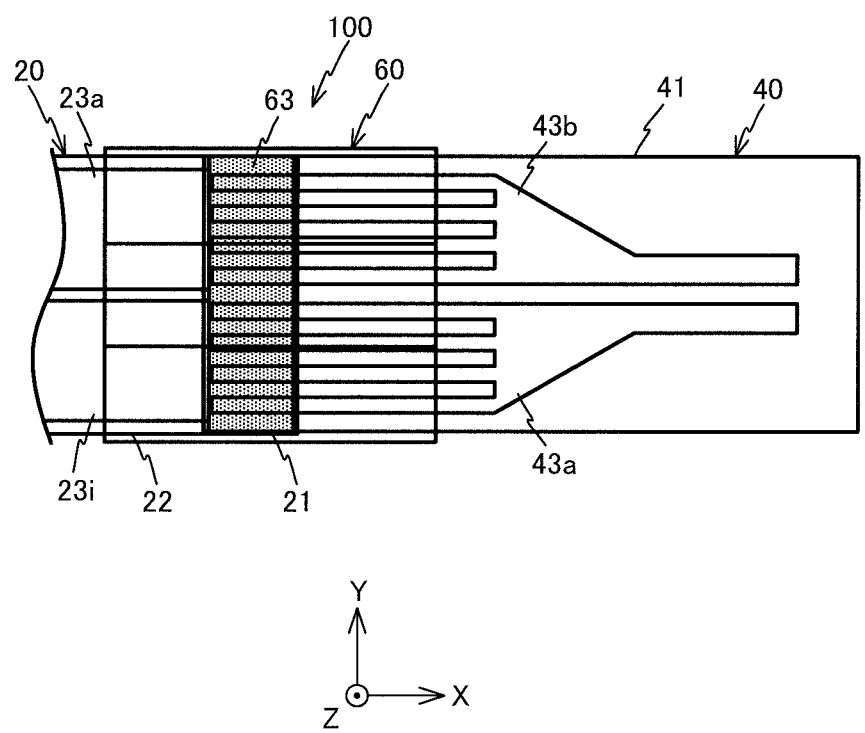
FIG. 14 is a plan view of the connection part of the light-emitting device.
Figure 15:
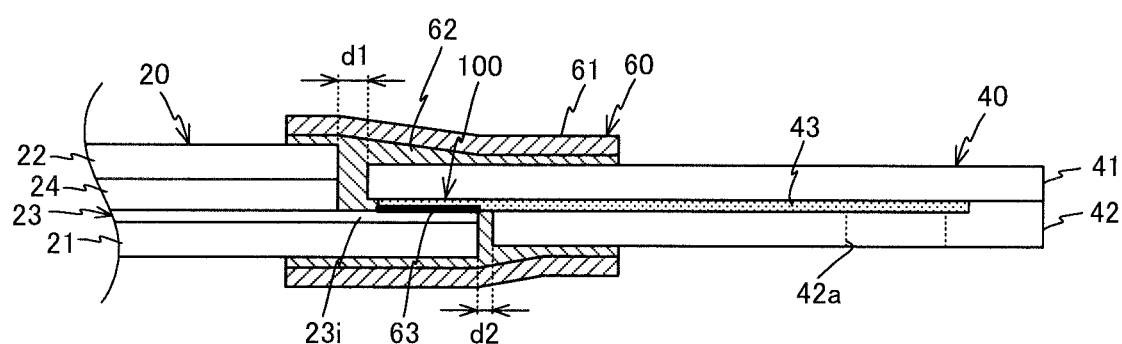
FIG. 15 is a cross-section view of the connection part of the light-emitting device.
Figure 15:
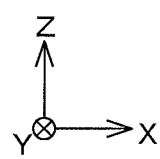

Therefore, as shown in FIGS. 14 and 15, the connection part 100 is preferably protected by coating with a mold resin 62 or a protective tape 61, or a composite sealing body 60 which is a composite of the mold resin and the protective tape.

The protective tape 61 is a film-shaped member, and preferably exhibits excellent heat resistance and insulation performance. As the protective tape 61, for example, polyimide, polyester, polyamide, liquid crystal polymer, PEEK (polyether ether ketone), etc. may be used.

The mold resin 62 is a thermosetting resin. As the thermosetting resin serving as the mold resin 62, an epoxy-based resin, an acrylic-based resin, a styrene-based resin, an ester-based resin, a urethane-based resin, a melamine resin, a phenol resin, an unsaturated polyester resin, a diallyl phthalate resin, polyimide, etc. can be used. The minimum melt viscosity of the mold resin 62 is 1.0E+0.5 Pa·s or less.

The mold resin 62 may also be a thermoplastic resin. As the thermoplastic resin, a polypropylene resin, a polyethylene resin, a polyvinyl chloride resin, an acrylic resin, a Teflon resin, a polycarbonate resin, an acrylonitrile-butadiene-styrene resin, or a polyamide-imide resin may be used. As the mold resin 62, a hot-melt adhesive may also be used. As the hot-melt adhesive, an ethylene/vinyl acetate-based adhesive, an olefin-based adhesive, a rubber-based adhesive, a polyamide (such as polyester)-based adhesive, or a polyurethane-based adhesive, or propylene or a thermoplastic olefin-based polymer in which propylene and ethylene or propylene and 1-butene, etc. are copolymerized, etc. can be used.

The gap between the intermediate resin layer 24 and the board 22 which constitute the light-emitting panel 20 and the coverlay 42 which constitutes the flexible wiring board 40, i.e. the space between position a1 and position b2 shown in FIG. 8, is preferably covered without any gap by the mold resin 62. The light-emitting panel 20 and the flexible wiring board 40 are designed and arranged so that a distance d1 (refer to FIG. 15) of the gap between position a1 at the +X side end of the board 21 and the position b2 at the −X side end of the substrate 41 is from 1 mm to 5 mm. The distance d1 is more preferably from 1.5 mm to 3 mm.

Further, the light-emitting panel 20 and the flexible wiring board 40 are designed and arranged so that a distance d2 of the gap between position a2 at the +X side end of the board 21 and the position b1 at the −X side end of the coverlay 42 is also from 1 mm to 5 mm. The distance d2 (refer to FIG. 5) is more preferably from 1.5 mm to 3 mm.

In the light-emitting device 10, by using the mold resin 62 to seal the connection part 100 of the light-emitting panel 20 and the flexible wiring board 40 and covering the outer periphery of the mold resin 62 with the protective tape 61, a seal with high mechanical reliability can be realized. To this end, the connection part 100 is covered with the mold resin 62 by applying or winding, etc. the mold resin 62 onto the connection part 100.

Once the protective tape 61 has been wound onto the mold resin 62, the mold resin 62 may be heated, thermocompression bonded, or vacuum thermocompression bonded, etc. However, in such a case, a gap may remain between the protective tape 61 and the mold resin 62. Therefore, a defect such as the intrusion of moisture into the connection part 100 may occur.

Figure 16:
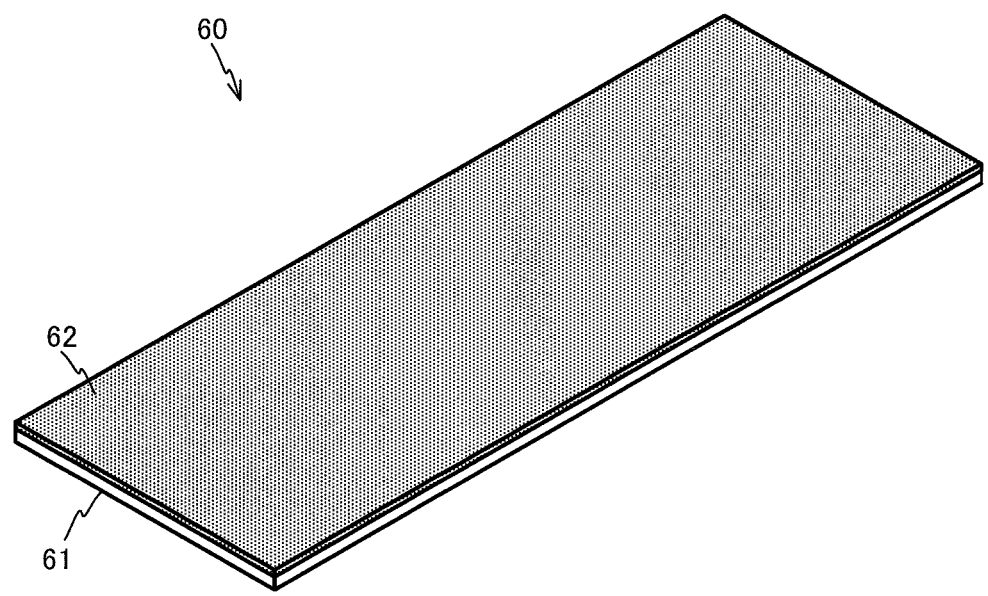
FIG. 16 is a schematic view of a composite sealing body.

Thus, as shown in FIG. 16, a composite sealing body 60 is prepared with a length such that the composite sealing body 60 can be wound around the connection part 100. The composite sealing body 60 consists of the protective tape 61 and the mold resin 62 which serves as an adhesive layer. The thickness of the mold resin 62 which constitutes the composite sealing body 60 is adjusted by, for example, laminating resin sheets having a thickness of 20 μm. For example, the thickness of the mold resin 62 is 60-120 μm. In this way, the composite sealing body 60 in which no gaps remain can be produced with few steps by winding the composite sealing body 60, in which the protective tape 61 and the mold resin 62 have been laminated in advance, around the connection part 100 and then performing vacuum thermocompression bonding.

Figure 17:
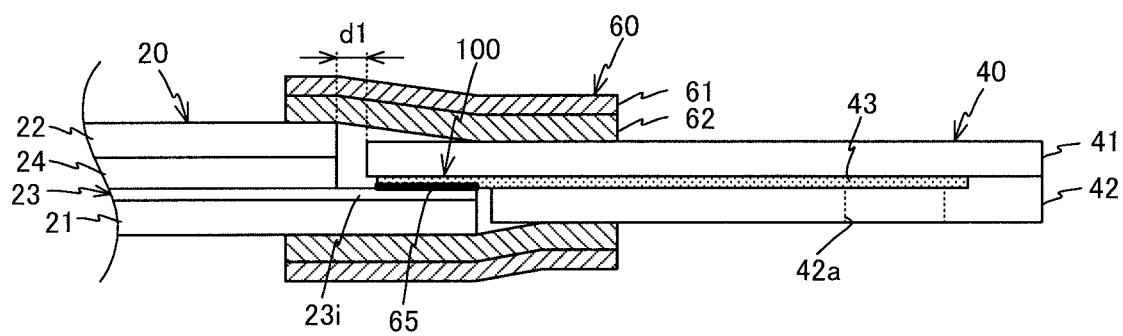
FIG. 17 is a diagram for explaining a method for protection by the composite sealing body.
Figure 17:
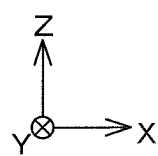

Specifically, as shown in FIG. 17, the composite sealing body 60 is wound around the connection part 100 of the light-emitting panel 20 and the flexible wiring board 40. The length of the composite sealing body 60 must be sufficient such that the composite sealing body 60 is wound once around the light-emitting panel 20 and the flexible wiring board 40 when the composite sealing body 60 has been wound around the connection part of the light-emitting panel 20 and the flexible wiring board 40. For example, the length of the composite sealing body 60 must be set to a length such that the composite sealing body 60 is wound around the light-emitting panel 20 and the flexible wiring board 40 at least 1.125 times and no more than 1.875 times. If less than this range, a defect such as the intrusion of water into the connection part 100 can easily occur, and if more than this range, the flexibility of the light-emitting device 10 is considerably lost.

When winding the composite sealing body 60 around the light-emitting panel 20 and the flexible wiring board 40, the composite sealing body 60 is temporarily fastened to the light-emitting panel 20 and the flexible wiring board 40. In order to temporarily fasten the composite sealing body 60, a separate adhesive may be applied onto the composite sealing body 60 or the mold resin 62 before winding the composite sealing body 60.

Next, the composite sealing body 60 is thermocompression bonded to the light-emitting panel 20 and the flexible wiring board 40. Thereby, the mold resin 62 of the composite sealing body 60 is filled between the light-emitting panel 20 and the flexible wiring board 40 without any gaps as shown in FIG. 15. The mold resin 62 adheres closely without any gaps to the side surfaces of the intermediate resin layer 24, the board 22, and the substrate 41 as well as the exposed conductor layer 23 (conductor patterns $23_1$, $23_9$).

The mold resin 62 does not necessarily have to be used together with the protective tape 61, and the mold resin 62 alone is sufficient as long as the mold resin 62 is formed to cover the connection part of the light-emitting panel 20 and the flexible wiring board 40.

In the light-emitting device 10 described above, when a direct-current (DC) voltage is applied via the connector 50 to the circuit patterns 43a, 43b shown in FIG. 4, the light-emitting elements 30 which constitute the light-emitting panel 20 emit light.

<Problems and Solutions when Connecting Flexible Conductor Boards with Anisotropic Conductive Film>

Figure 18:
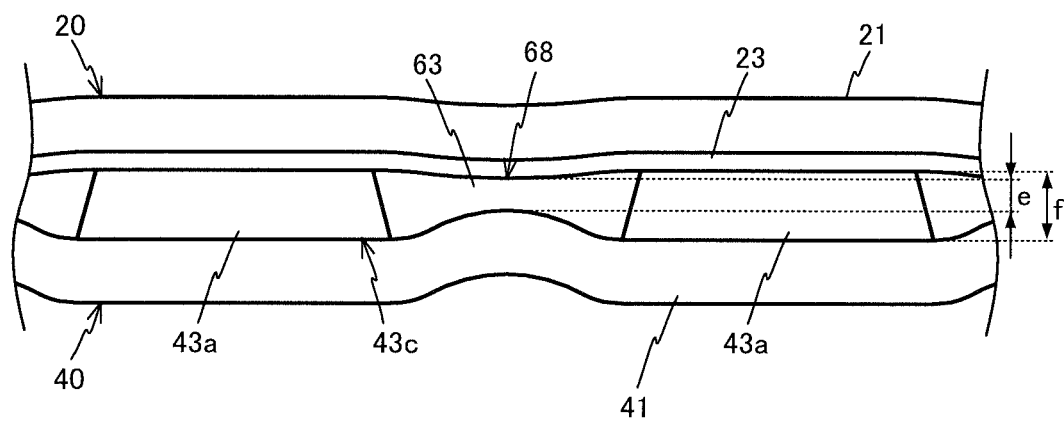
FIG. 18 is a diagram that schematically illustrates a cross-section of the connection part of the light-emitting device.

Next, examples of the light-emitting device 10 according to the present embodiment shall be explained. FIG. 18 schematically illustrates a cross-section along line A-A (hereinafter referred to as the connection part cross-section) of the light-emitting device 10 shown in FIG. 4. In the light-emitting device 10, as shown in FIG. 18, near the conductive comb-shaped exposed part 43c, e.g. between the branched circuit patterns 43a, the substrate 41 is curved so as to protrude between adjacent circuit patterns 43a. Further, the conductor layer 23 is also similarly curved so as to protrude between adjacent circuit patterns 43a. This curving of the substrate 41 and the conductor layer 23 is partially caused by the pressurization process during manufacture of the light-emitting device 10, but the main cause of this curving is because the thermosetting resin which constitutes the anisotropic conductive film 630 causes curing shrinkage during the bonding step.

Figure 28A:
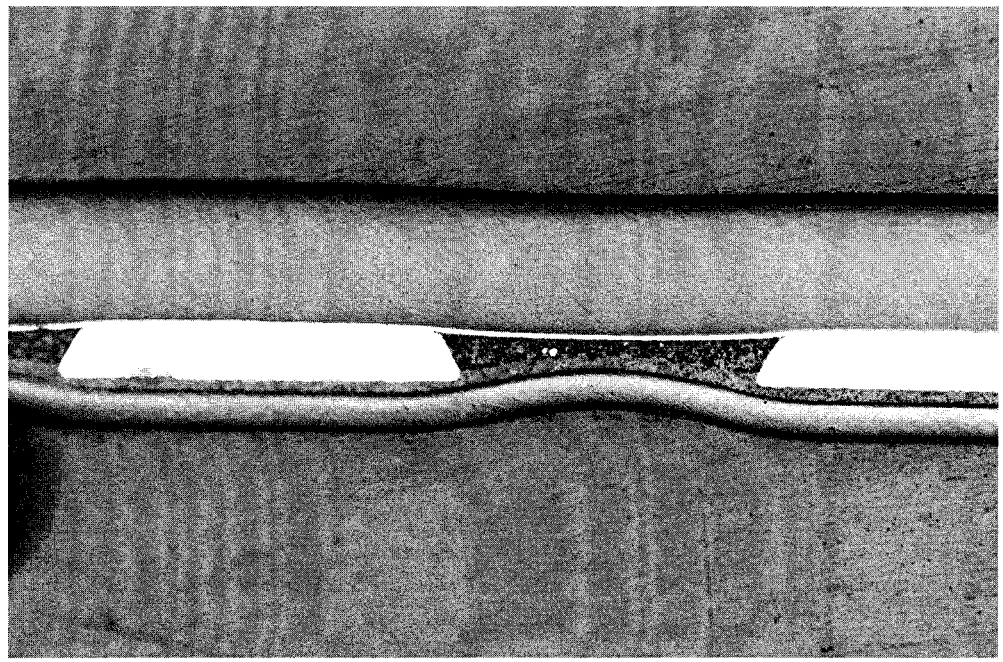
FIG. 28A is a photograph of a cross-section of the connection part of the light-emitting device corresponding to the schematic view of FIG. 18.
Figure 28B:
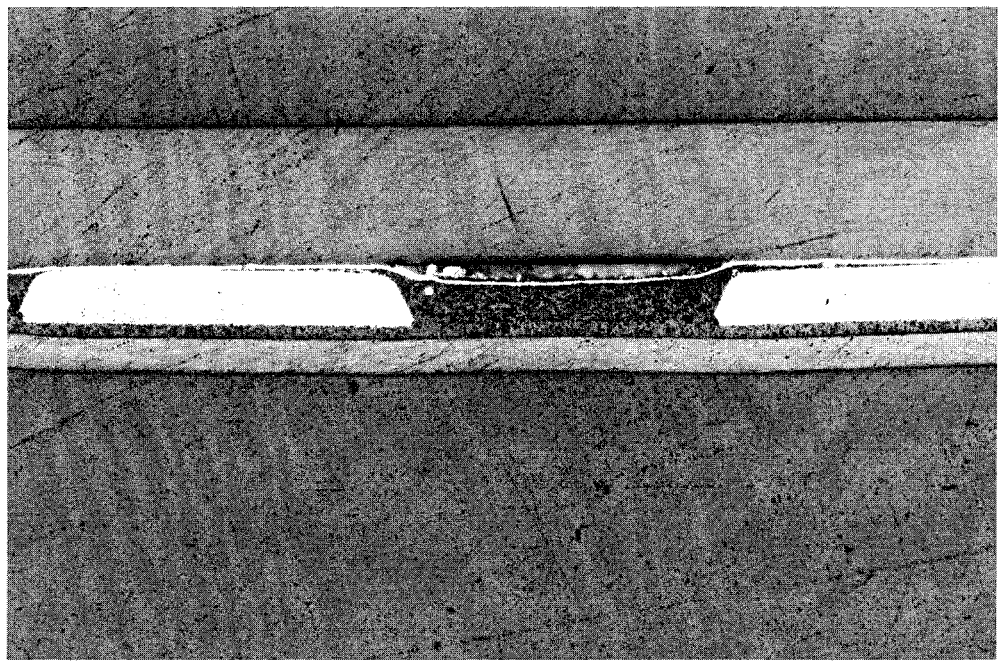
FIG. 28B is a photograph of a cross-section of the connection part of the light-emitting device corresponding to the schematic view of FIG. 18.
Figure 29A:
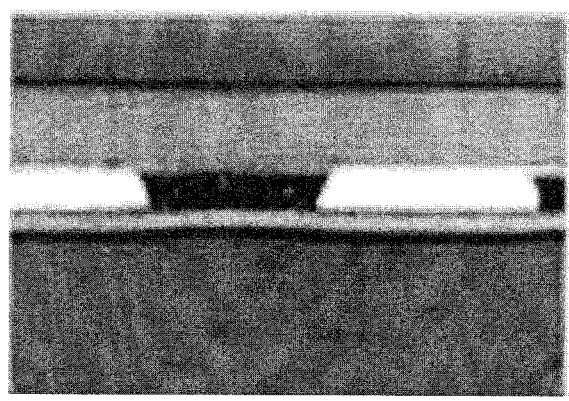
FIG. 29A is a photograph of a cross-section of the connection part of the light-emitting device according to Example 1.
Figure 29B:
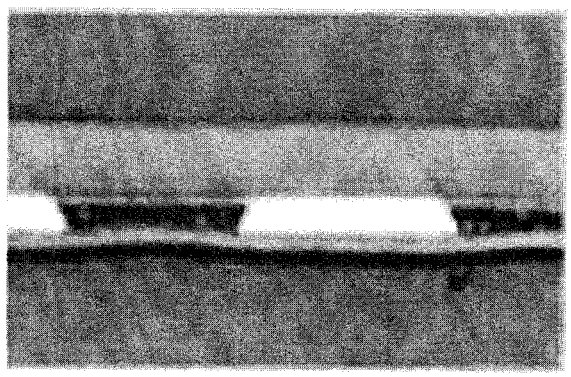
FIG. 29B is a photograph of a cross-section of the connection part of the light-emitting device according to Example 2.
Figure 29C:
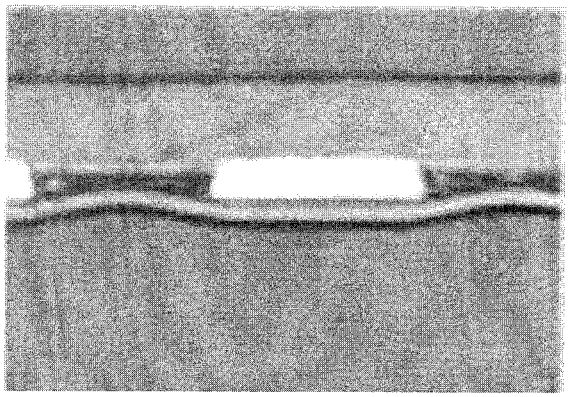
FIG. 29C is a photograph of a cross-section of the connection part of the light-emitting device according to Example 3.
Figure 29D:
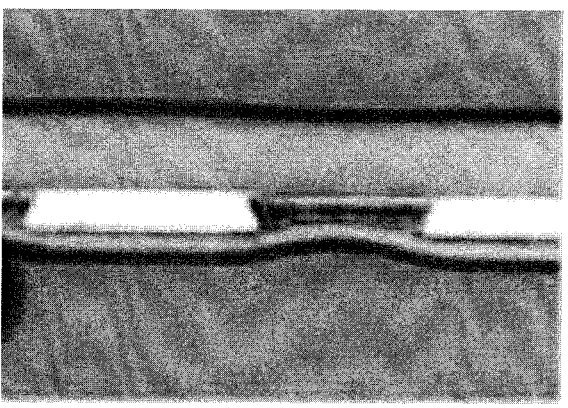
FIG. 29D is a photograph of a cross-section of the connection part of the light-emitting device according to Example 4.
Figure 29E:
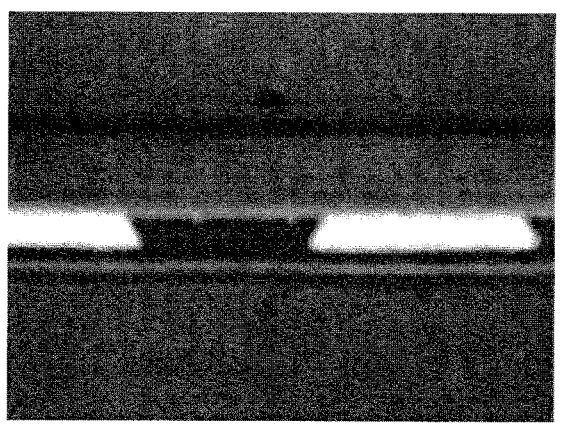
FIG. 29E is a photograph of a cross-section of the connection part of the light-emitting device according to Example 5.
Figure 29F:
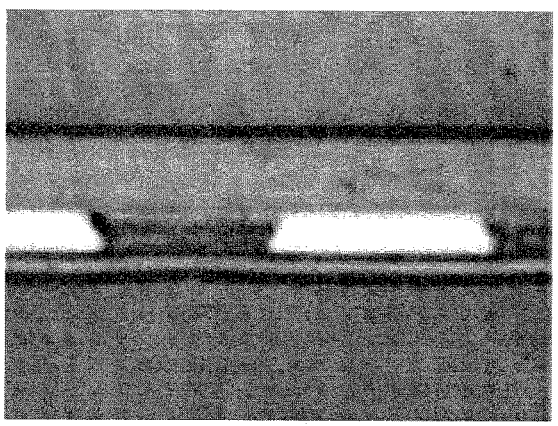
FIG. 29F is a photograph of a cross-section of the connection part of the light-emitting device according to Example 6.
Figure 29G:
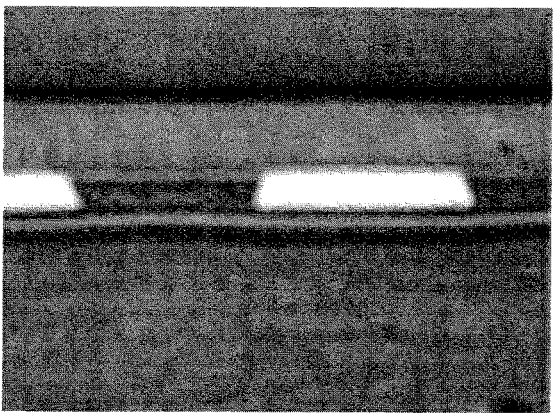
FIG. 29G is a photograph of a cross-section of the connection part of the light-emitting device according to Example 7.
Figure 29H:
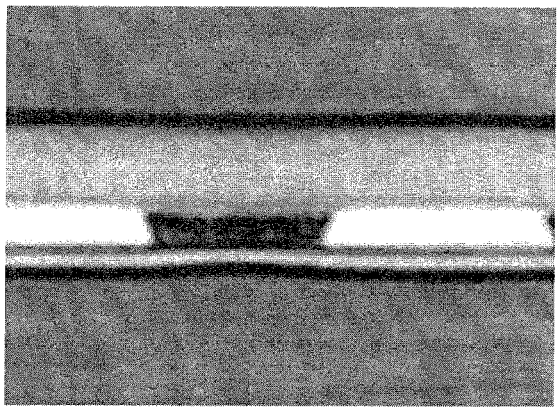
FIG. 29H is a photograph of a cross-section of the connection part of the light-emitting device according to Example 8.
Figure 30A:
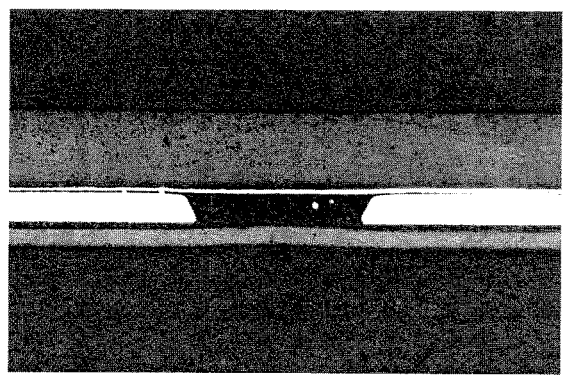
FIG. 30A is a photograph of a cross-section of the connection part of the light-emitting device according to Example 1.
Figure 30B:
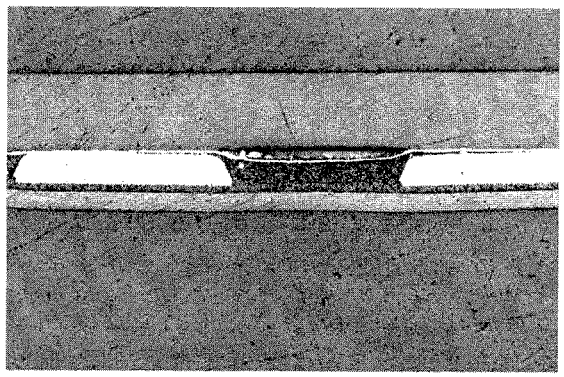
FIG. 30B is a photograph of a cross-section of the connection part of the light-emitting device according to Example 2.
Figure 30C:
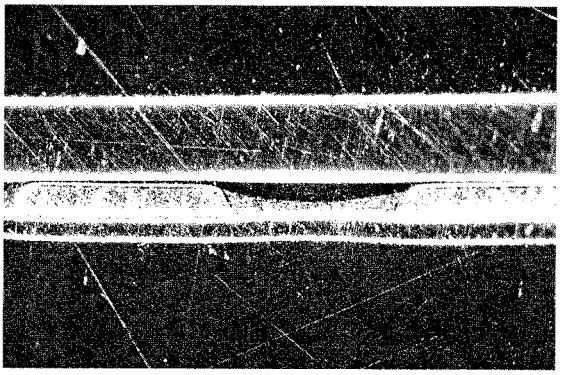
FIG. 30C is a photograph of a cross-section of the connection part of the light-emitting device according to Example 3.
Figure 30D:
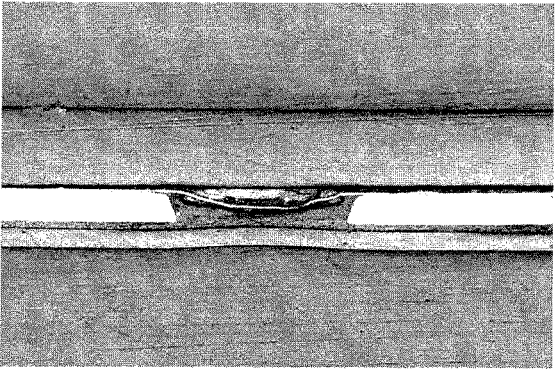
FIG. 30D is a photograph of a cross-section of the connection part of the light-emitting device according to Example 4.
Figure 30E:
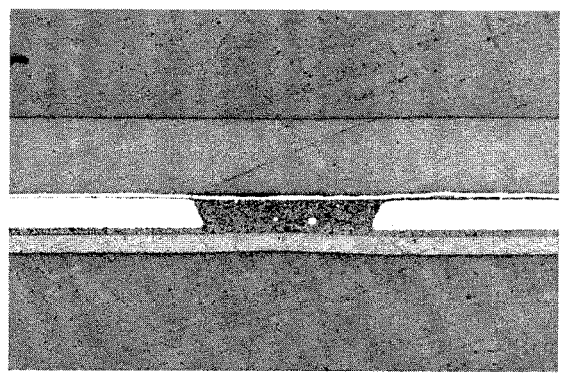
FIG. 30E is a photograph of a cross-section of the connection part of the light-emitting device according to Example 5.
Figure 30F:
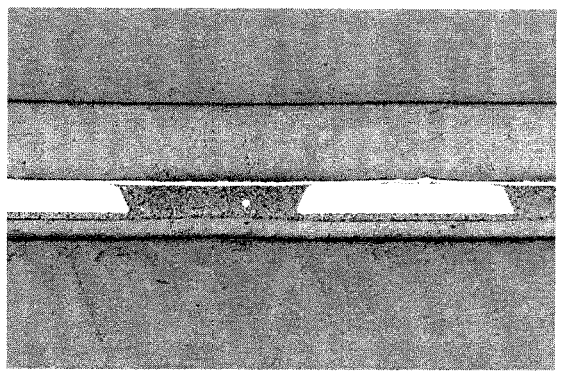
FIG. 30F is a photograph of a cross-section of the connection part of the light-emitting device according to Example 6.
Figure 30G:
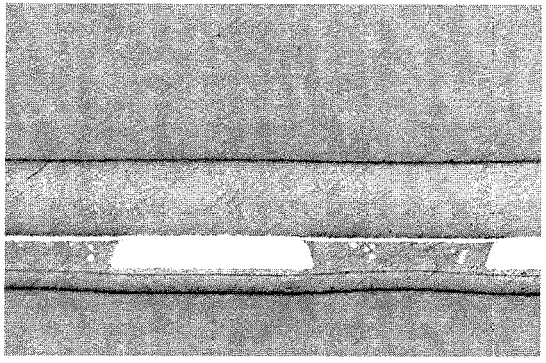
FIG. 30G is a photograph of a cross-section of the connection part of the light-emitting device according to Example 7.
Figure 30H:
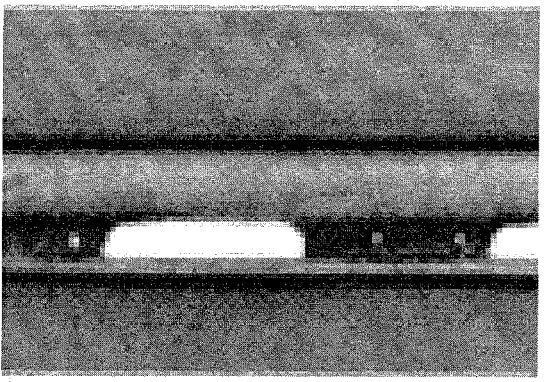
FIG. 30H is a photograph of a cross-section of the connection part of the light-emitting device according to Example 8.
Figure 31A:
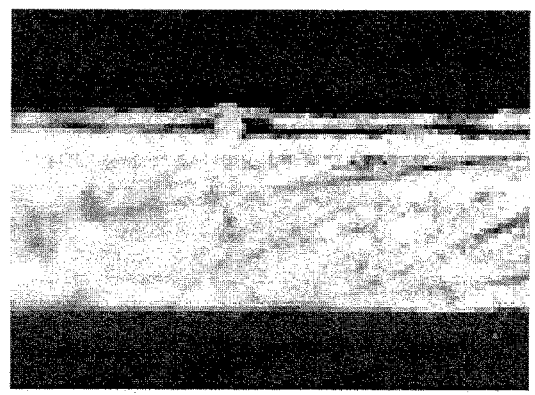
FIG. 31A is a photograph of a cross-section of the connection part of the light-emitting device according to Example 1.
Figure 31B:
FIG. 31B is a photograph of a cross-section of the connection part of the light-emitting device according to Example 2.
Figure 31C:
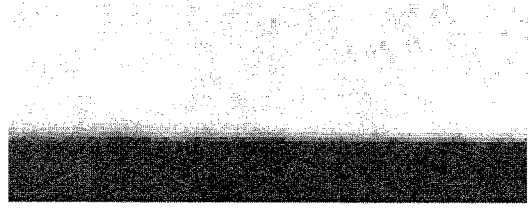
FIG. 31C is a photograph of a cross-section of the connection part of the light-emitting device according to Example 3.
Figure 31D:
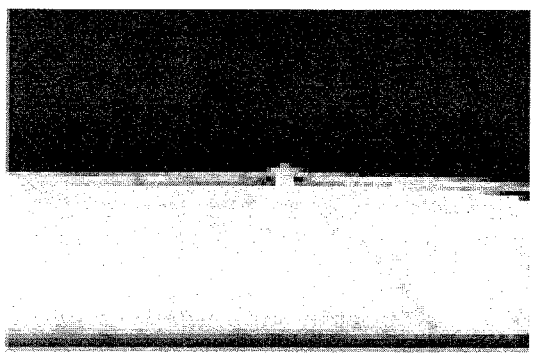
FIG. 31D is a photograph of a cross-section of the connection part of the light-emitting device according to Example 4.
Figure 32A:
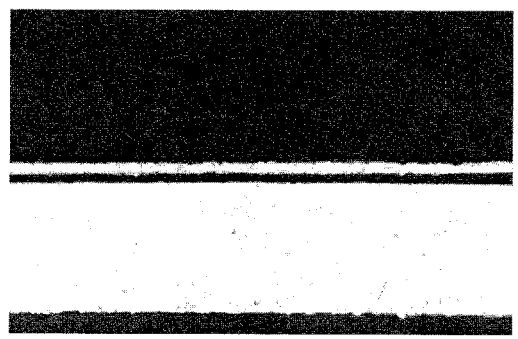
FIG. 32A is a photograph of a cross-section of the connection part of the light-emitting device according to Example 1.
Figure 32B:
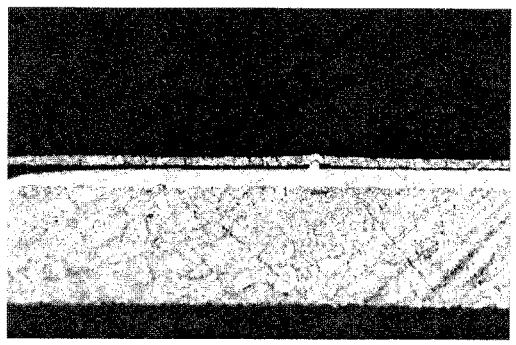
FIG. 32B is a photograph of a cross-section of the connection part of the light-emitting device according to Example 2.
Figure 32C:
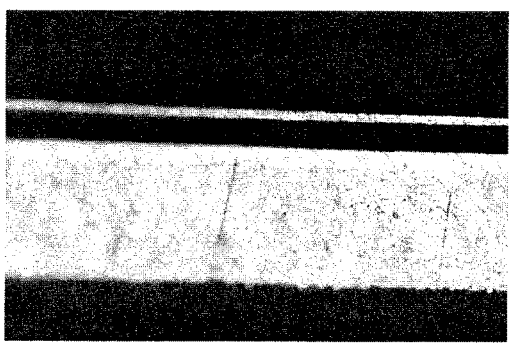
FIG. 32C is a photograph of a cross-section of the connection part of the light-emitting device according to Example 3.
Figure 32D:
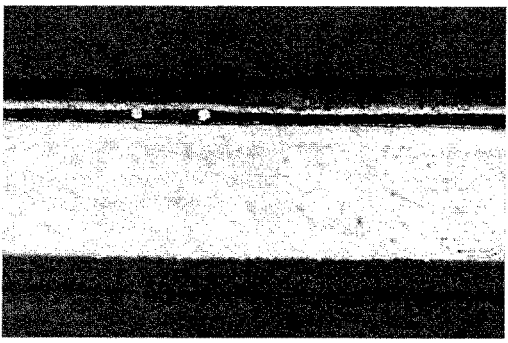
FIG. 32D is a photograph of a cross-section of the connection part of the light-emitting device according to Example 4.
Figure 32E:
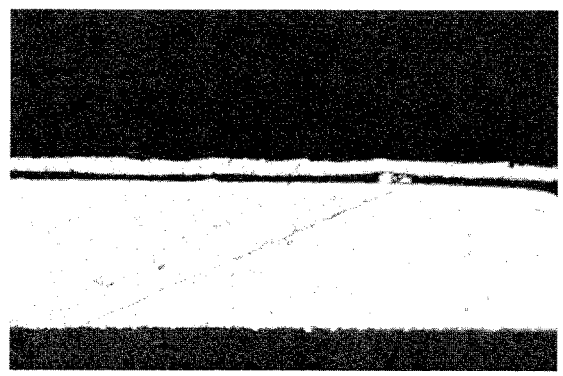
FIG. 32E is a photograph of a cross-section of the connection part of the light-emitting device according to Example 5.
Figure 32F:
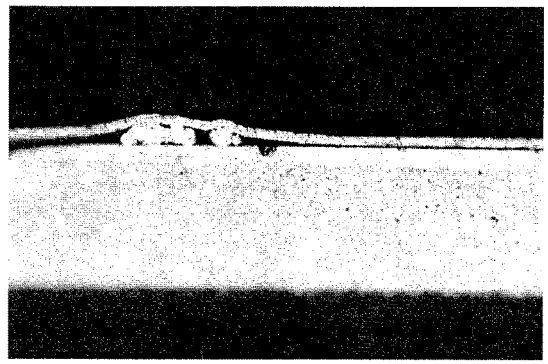
FIG. 32F is a photograph of a cross-section of the connection part of the light-emitting device according to Example 6.
Figure 32G:
FIG. 32G is a photograph of a cross-section of the connection part of the light-emitting device according to Example 7.
Figure 32H:
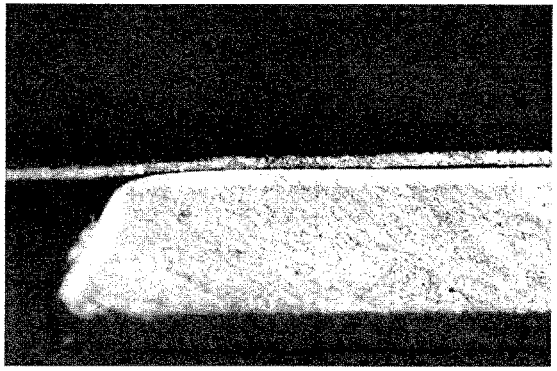
FIG. 32H is a photograph of a cross-section of the connection part of the light-emitting device according to Example 8.

For example, FIGS. 28A and 28B are microscope photographs of the connection part cross-section of the light-emitting device 10 corresponding to the schematic view of FIG. 18.

The light-emitting device 10 shown in the photograph of FIG. 28A includes the light-emitting panel 20 having the conductor layer 23 and the flexible wiring board 40 in which the substrate 41 is a glass epoxy substrate of the light-emitting device 10 according to the above-described embodiment. The light-emitting panel 20 and the flexible wiring board 40 are connected via the anisotropic conductive layer 63. The light-emitting device 10 shown in the photograph of FIG. 28A was used for 1000 hours in an environment where the temperature is 85° C. and the humidity is 85%. In the light-emitting device 10 of FIG. 28A, it can be seen that substrate 41 as well as the board 21 and the conductive layer 23 are curved so as to protrude between the circuit patterns.

The light-emitting device shown in the photograph of FIG. 28B is a light-emitting device according to a comparative example. In this comparative example, the board 21 is made of a rigid glass epoxy substrate rather than a PET film. The comparative example shown in the photograph of FIG. 28B was used for 1000 hours in an environment where the temperature is 85° C. and the humidity is 85%. In the light-emitting device 10 of FIG. 28B, it can be seen that the substrate 41 and the conductive layer 23 are curved so as to protrude between the conductor patterns. The board 21 is nearly flat because the curvature was released and the board 21 was restored. Therefore, peeling can be observed between the conductor layer 23 and the board 21.

The reliability of the mechanical/electrical connection of the light-emitting device 10 decreases due to use over a long period in high humidity. The peeling between the board 21 and the conductor layer 23 due to the restoration of the board 21 of the light-emitting panel 20 which had been curved is also believed to be a factor causing the decrease in reliability. For example, it is believed that if the degree of curving of the board 21 is small, then peeling of the conductor layer 23 from the board 21 due to use in a high-temperature, high-humidity environment does not occur as easily. Thus, various tests were conducted by changing the composition of the anisotropic conductive layer 63 and the conditions of the vacuum pressurization heat treatment.

Examples 1 to 8

Light-emitting devices 10 were prepared according to Examples 1 to 8 using two types of anisotropic conductive layers (an anisotropic conductive layer A and an anisotropic conductive layer B) having different curing shrinkage rates as an anisotropic conductive layer 63. The anisotropic conductive layer A was used for the light-emitting devices 10 according to Examples 1 to 4, and the anisotropic conductive layer B was used for the light-emitting devices 10 according to Examples 5 to 8.

The anisotropic conductive layer A includes, as the main component, an epoxy-based thermosetting resin, and also includes, as the conductive particles, Ni particles having an average particle diameter of 5 μm. The anisotropic conductive layer B includes, as the main component, a fluorene-based curing resin, and also includes, as the conductive particles, Ni particles having an average particle diameter of 5 μm. After temporarily adhering the anisotropic conductive layer A or the anisotropic conductive layer B to a conductor exposed part 43d of the wiring board conductor layer 43 of the flexible wiring board 40 shown in FIG. 7, the separator was peeled off, and a conductor layer exposed part 23z of the light-emitting panel 20 shown in FIG. 3 was laminated thereon. Next, vacuum thermocompression bonding was carried out so as to connect the light-emitting panel 20 and the flexible wiring board 40. This manufacturing process was carried out while changing the pressurization force used during the vacuum thermocompression bonding in four ways. Herein, six samples of each of the 8 types of examples (Examples 1 to 8) were prepared. The conditions during the vacuum thermocompression bonding are shown in FIG. 19. The "temperature", "pressurization force", and "time" in the table shown in FIG. 19 indicate the temperature, pressurization force, and pressurization time during the vacuum thermocompression bonding.

The light-emitting panel 20 and the flexible wiring board 40 of the light-emitting device 10 in each of Examples 1 to 8 are electrically connected, via the conductive particles 67 of the anisotropic conductive layer 63, between the conductor layer exposed part 23z of the light-emitting panel 20 and the conductor exposed part 43d of the flexible wiring board 40. The board 21 is a flexible PET film having a thickness of 100 μm, and the substrate 41 of the flexible wiring board 40 is a flexible polyimide film having a thickness of 25 μm. The thickness of the circuit patterns 43a, 43b at the conductor exposed part 43d is 25 µm, but the thickness of the conductor patterns $23_1$, $23_9$ at the conductor layer exposed part 23z is 2 µm, and thus is thin in relative and absolute terms among the constituent members appearing in the connection part cross-section shown in FIG. 18.

As shown in FIG. 18, once the step for connecting the light-emitting panel 20 and the flexible wiring board 40 via the anisotropic conductive layer 63 has been completed, the adhesive material layer 66 deforms and shrinks due to both the pressurization force during thermocompression bonding and the heat curing shrinkage of the adhesive material layer 66, and thus the board 21 and the substrate 41 become recessed toward the inside. Thereby, in the connection part 100 of the light-emitting panel 20 and the flexible wiring board 40, the light-emitting device 10 is deformed to a peapod shape in which the portions corresponding to the circuit patterns 43a, 43b of the conductive comb-shaped exposed part 43c are thicker. Due to this configuration, the conductor layer exposed part 23z and the conductor exposed part 43d are strongly connected.

Meanwhile, a restorative force generated by the board 21 and the substrate 41 trying to return to their original flat shape, i.e. tensile stress, acts on the adhesive material layer 66. This is not a problem as long as the light-emitting device 10 manufactured as described above is used in the temperature/humidity conditions of a normal indoor/outdoor environment, but this may lead to a problem if the light-emitting device 10 is installed in a vehicle or the like.

For example, FIG. 28B is a typical survey microscope photograph showing the connection part cross-section of the light-emitting devices 10 according to Examples 2 to 4 after being used for 1000 hours in an environment where the temperature is 85° C. and the humidity is 85%. It can be seen that the conductor layer 23 is peeling away from the board 21.

FIGS. 29A to 29H are microscope photographs of the connection part cross-section of the light-emitting devices 10 according to Examples 1 to 8 before use. Further, FIGS. 30A to 30H are microscope photographs of the connection part cross-section of the light-emitting devices 10 according to Examples 1 to 8 after being used for 1000 hours in an environment where the temperature is 85° C. and the humidity is 85%. As can be understood from FIGS. 29A-29H and FIGS. 30A-30H, peeling of the conductor layer 23 from the board 21 was not observed in Examples 1 and 5 to 8.

As shown in FIG. 19, in the light-emitting devices 10 according to Examples 1 and 5 to 8, the curvature ratio of an insulation part 68 (refer to FIG. 18) of the anisotropic conductive layer 63 was 0.96, 0.97, 0.88, 0.85, and 0.8, respectively. Therefore, it can be said that if the curvature ratio of the insulation part 68 is at least 0.75 and no more than 0.9, then peeling of the conductor layer 23 of the light-emitting panel 20 does not occur even after a 1000-hour moisture resistance test (PCT).

The curvature ratio as used herein is a ratio (e/f) of a minimum distance e between the substrate 41 of the flexible wiring board 40 and the board 21 at a portion where the conductor patterns $23_1$, $23_9$ and the circuit patterns 43a, 43b are not in electrical contact with each other in the anisotropic conductive layer 63 relative to a distance f between the substrate 41 of the flexible wiring board 40 and the board 21 at a portion where the conductor patterns $23_1$, $23_9$ and the circuit patterns 43a, 43b are in electrical contact with each other in the anisotropic conductive layer 63.

If the curvature ratio of the insulation part 68 is at least 0.75 and no more than 0.9, then the ratio of the distance e to the distance f is at least ¾ and no more than 9/10.

The "contact resistance" in the table of FIG. 19 indicates a resistance value of the connection part 100 measured upon connecting in series the conductor patterns $23_1$-$23_9$ of the light-emitting device 10 by means of wire bonding using a gold wire having a diameter of 20 µm. In the light-emitting devices 10 according to Examples 1 to 8, the result shown in the table of FIG. 19 is the average value of the contact resistance of 5 samples.

FIG. 20 indicates the contact resistance and a gap GA of the light-emitting devices 10 according to Examples 1 to 8 before and after a 1000-hour test (PCT) at a high temperature and a high humidity. Further, FIGS. 31A-31H and FIGS. 32A-32H are microscope photographs of the connection cross-section of the light-emitting devices 10 according to Examples 1 to 8. The photographs in FIGS. 31A-31H show the connection cross-section before the PCT, and the photographs in FIGS. 32A-32H show the connection cross-section after the PCT.

Figure 21:
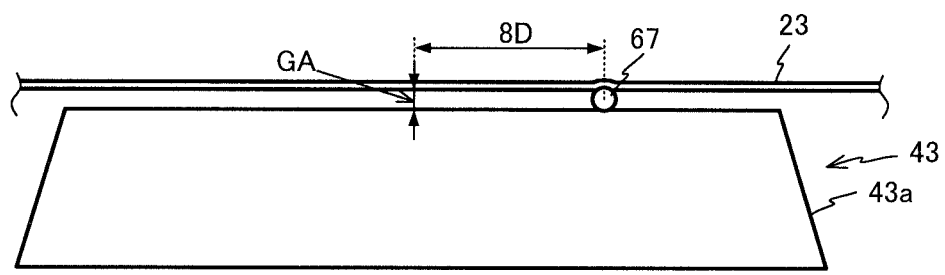
FIG. 21 is a diagram that schematically illustrates the relationship between a conductor layer, a wiring board conductor layer, and a conductive particle.
Figure 33:
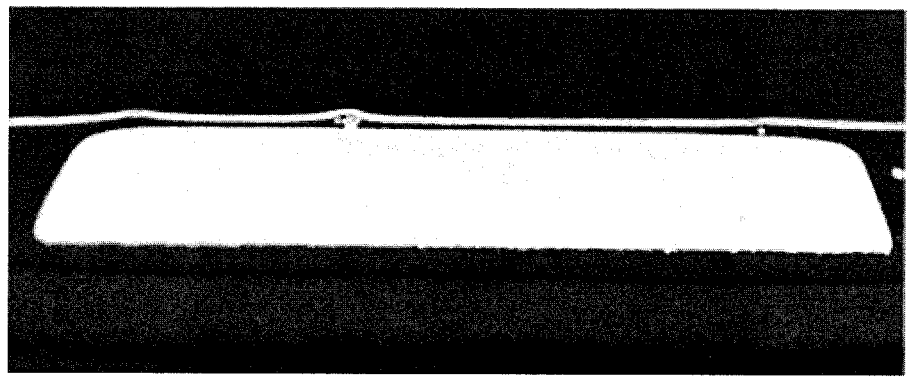
FIG. 33 is a photograph of a cross-section of the connection part of the light-emitting device.

FIG. 21 schematically illustrates the positional relationship between the conductor layer 23 at the conductor layer exposed part 23z of the light-emitting panel 20, the wiring board conductor layer 43 at the conductor exposed part 43d of the flexible wiring board 40, and the conductive particles 67. FIG. 21 corresponds to the photograph of FIG. 33.

As can be understood upon referring to FIG. 21, the gap GA indicates the interval between the wiring board conductor layer 43 and the conductor layer 23 at a point spaced apart in a direction along the board 21 by a distance 8D, which is 8 times a diameter D of the conductive particle 67, from a contact point of the conductive particle 67 included in the anisotropic conductive layer 63 which contacts both the wiring board conductor layer 43 at the conductive comb-shaped exposed part 43c and the conductor layer 23 at the conductor layer exposed part 23z, in a region where the conductor layer 23 at the conductor layer exposed part 23z of the light-emitting panel 20 is in electrical contact with the wiring board conductor layer 43 at the conductor exposed part 43d of the flexible wiring board 40.

Figure 22:
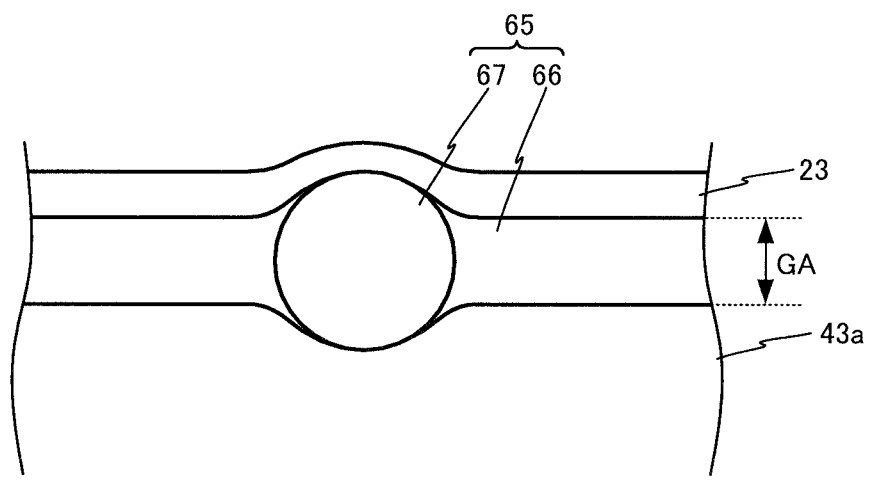
FIG. 22 is an expanded schematic view of the conductive particle that contacts both the wiring board conductor layer and the conductor layer.

FIG. 22 is an expanded schematic view of the conductive particle 67 that contacts both the wiring board conductor layer 43 and the conductor layer 23. As shown in FIG. 22, the gap GA is smaller than the diameter D of the conductive particle 67.

In the case that the average diameter of the conductive particles 67 of the anisotropic conductive film 630 is 5 µm, it can be understood upon referring to the table of FIG. 20 that good contact resistance can be obtained if the gap GA is no more than 2.5 µm. The value of the contact resistance in this case is approximately 100 nΩ or less. Further, if the gap GA drops below 0.2 µm, then the curvature ratio e/f falls below ¾, and peeling occurs between the conductor layer 23 and the board 21 after the PCT, as seen in the light-emitting devices 10 according to Examples 2 to 4 shown in FIG. 19. Therefore, the gap GA is preferably at least 0.2 µm and is no more than 2.5 µm.

In other words, good contact resistance can be obtained as long as the gap GA is no more than ½, and at least 1/20 of the average diameter of the conductive particles 67 of the anisotropic conductive film 630. Further, in order to keep the contact resistance between the conductor layer 23 of the light-emitting panel 20 and the wiring board conductor layer 43 of the flexible wiring board 40 sufficiently low even after the 1000-hour PCT, the pressurization force during thermocompression bonding of the conductor layer 23 of the light-emitting panel 20 and the wiring board conductor layer 43 of the flexible wiring board 40 via the anisotropic conductive layer 63 must be at least 0.75 MPa and no more than 3.5 MPa.

In the present embodiment, when manufacturing the light-emitting device 10, for example, the composite sealing body 60 is wound around the connection part 100 of the light-emitting panel 20 and the flexible wiring board 40 as shown in FIG. 17. Next, the composite sealing body 60 is thermocompression bonded to the light-emitting panel 20 and the flexible wiring board 40. Upon completion of these steps, the mold resin 62 is filled between the light-emitting panel 20 and the flexible wiring board 40.

The mold resin 62 adheres closely without any gaps to the side surfaces of the intermediate resin layer 24, the board 22, and the substrate 41 as well as the exposed conductor layer 23 (conductor patterns $23_1$, $23_9$). Therefore, the exposed conductor layer 23 is not exposed to external air or condensation, and corrosion of the conductor layer 23 and insulation breakdown due to migration can be suppressed. In turn, deterioration over time of the connection part 100 can also be suppressed, and thus the reliability of the light-emitting device 10 can be improved.

The gap lengths d1, d2 between the light-emitting panel 20 and the flexible wiring board 40 shown in FIG. 15 are preferably at least 1 mm and no more than 5 mm, more preferably at least 1.5 mm and no more than 3 mm. The reason for this is because when the composite sealing body 60 is vacuum thermocompression bonded, the mold resin 62 deforms and expands so as to fill in the gaps near the connection part 100, and the cushioning effect achieved thereby prevents deformation of the connection part 100. As a result, the reliability of the connection part is improved and the intrusion of water from the outside is prevented. If the gap length is less than 1 mm, gaps tend to form because the mold resin cannot be sufficiently filled therein. If the gap length exceeds 5 mm, the bonding at the gap portion weakens, and peeling or cracking may occur under severe usage conditions such as the repeated application of stress, and thus the long-term reliability is lost.

For example, the protective tape 61 alone could be used as a measure for reinforcement and moisture-proofing of the connection part 100 after the light-emitting panel 20 and the flexible wiring board 40 have been adhered with the anisotropic conductive film 630. However, with only the protective tape 61, it would be difficult to sufficiently seal from the outside the gap between the light-emitting panel 20 and the flexible wiring board 40 which are connected to each other. Therefore, insulation breakdown due to migration and deterioration over time of the connection part 100 could not be sufficiently suppressed.

In the present embodiment, since the mold resin 62 is filled without any gaps between the light-emitting panel 20 and the flexible wiring board 40, insulation breakdown due to migration and deterioration over time of the connection part 100 can be sufficiently suppressed.

Further, the mold resin 62 can be formed easily and in a short amount of time compared to a case in which, for example, the mold resin 62 is formed by resin bonding or by applying the resin with a dispenser. In addition, in the present embodiment, the process for forming the mold resin 62 can be carried out concurrently with the process for thermocompression bonding of the composite sealing body 60. Therefore, the manufacturing process of the light-emitting device 10 can be simplified, and thus the manufacturing cost of the light-emitting device 10 can be reduced.

The thickness of the mold resin 62 of the composite sealing body 60 is preferably 60 µm or more, more preferably 80 µm or more. By setting the thickness of the mold resin 62 of the composite sealing body 60 to be 60 µm or more, moisture, etc. can be prevented from penetrating into the connection part 100 of the light-emitting panel 20 and the flexible wiring board 40. Further, by setting the thickness of the mold resin 62 of the composite sealing body 60 to be 80 µm or more, moisture, etc. can be almost completely prevented from penetrating into the connection part 100 of the light-emitting panel 20 and the flexible wiring board 40.

In the light-emitting device 10, from the viewpoint of ensuring the flexibility, the thickness of the mold resin 62 of the composite sealing body 60 should be small. In the present embodiment, by setting the thickness of the mold resin 62 of the composite sealing body 60 to be 160 µm or less, the flexibility of the light-emitting device 10 can be maintained.

By thermocompression bonding the mold resin 62 of the composite sealing body 60, the thickness of the mold resin 62 becomes about 80%. Therefore, the thickness of the mold resin 62 of the light-emitting device 10 is preferably 56 µm or more, more preferably 64 µm or more. Further, the thickness of the mold resin 62 of the light-emitting device 10 is preferably 128 µm or less. Therefore, the thickness of the thickest portion of the light-emitting device 10 including the composite sealing body 60 at the connection part 100 of the light-emitting panel 20 and the flexible wiring board 40 must be at least a value obtained by adding 138 µm to the thickness of the light-emitting panel 20, and no more than a value obtained by adding 446 µm to the thickness of the light-emitting panel 20.

The optimal value of the thickness of the mold resin 62 defined as described above fluctuates according to the sum of the thicknesses of the board 22 and the intermediate resin layer 24. In the light-emitting device 10, the sum (SUM) of the thickness of the board 22 and the thickness of the intermediate resin layer 24 is about 220 µm. In the light-emitting device 10, the thickness of the mold resin 62 may be less than the SUM, and the thickness of the mold resin 62 should be at least 25% and no more than 58% of the SUM, more preferably at least 29% and no more than 58% of the SUM.

Similarly, the optimal value of the thickness of the mold resin 62 fluctuates according to the thickness of the flexible wiring board 40. In the light-emitting device 10, the thickness of the flexible wiring board 40 is about 80 µm. In the light-emitting device 10, the thickness of the mold resin 62 is preferably at least 70% and no more than 160% of the thickness of the flexible wiring board 40, more preferably at least 80% and no more than 160% of the thickness of the flexible wiring board 40.

In the light-emitting device 10 having the protective tape 61 and the mold resin 62, the adhesion strength near the connection part of the light-emitting panel 20 and the flexible wiring board 40 can be maintained at a high level. Thus, peeling apart of the light-emitting panel 20 and the flexible wiring board 40 can be suppressed.

In the light-emitting device 10, as shown in FIG. 15, the distance d1 between the board 22 and the flexible wiring board 40 is about 2 mm. The thickness of the mold resin 62 is preferably at least 2% and no more than 5% of the distance d1, more preferably at least 3% and no more than 5% of the distance d1.

As shown in FIG. 3, the boards 21, 22 have a shape that is curved along the light-emitting elements 30. Specifically, the thickness of the intermediate resin layer 24 is less than the height of the light-emitting elements $30_1$-$30_8$ so that good contact can be achieved between the conductor layer 23 and the bumps 37, 38. The boards 21, 22, which are closely adhered to the intermediate resin layer 24, have a curved shape in which the portions where the light-emitting elements $30_1$-$30_8$ are disposed protrude toward the outside and the portions between the light-emitting elements $30_1$-$30_8$ are recessed. Since the boards 21, 22 are curved in this way, the conductor layer 23 is pressed against the bumps 37, 38 by the boards 21, 22.

Embodiments of the present invention have been explained above, but the present invention is not limited to these embodiments. For example, in the above embodiments, the light-emitting device 10 was provided with 8 light-emitting elements 30 connected in series. However, the present invention is not limited thereto, and the light-emitting device 10 may be provided with 9 or more, or 7 or less light-emitting elements. The light-emitting device 10 may also be provided with a plurality of light-emitting elements 30 connected in parallel. Further, the light-emitting device 10 may be provided with a plurality of light-emitting elements 30 consisting of a mixture of light-emitting elements 30 connected in series and light-emitting elements 30 connected in parallel.

In the above embodiments, the case in which the conductor layer 23 is made of metal was explained. However, the present invention is not limited thereto, and the conductor layer 23 may be constituted from a transparent conductive material such as ITO.

In the above embodiments, the case in which the bumps 37, 38 are formed on the electrodes 35, 36 of the light-emitting elements 30 was explained. However, the present invention is not limited thereto, and bumps 37, 38 do not have to be formed on the electrodes 35, 36 of the light-emitting elements 30.

In the above embodiments, the pair of electrodes 35, 36 are formed on one surface of each light-emitting element 30. However, the present invention is not limited thereto, and each light-emitting element 30 may have an electrode formed on one surface and an electrode formed on the other surface. In this case, a conductor layer is formed on the board 22 as well.

Figure 23:
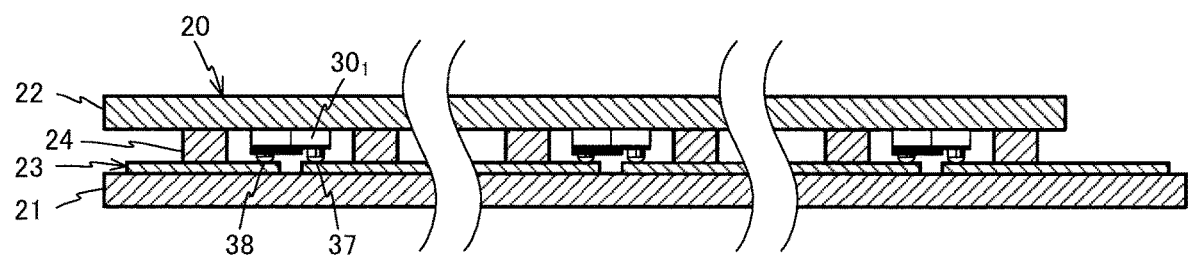
FIG. 23 shows an alternative example of the light-emitting panel.

In the above embodiments, the case in which the intermediate resin layer 24 was formed with no gaps between the boards 21, 22 was explained. However, the present invention is not limited thereto, and the intermediate resin layer 24 may be formed partially between the boards 21, 22. For example, the intermediate resin layer 24 may be formed only around the light-emitting elements. Further, for example, as shown in FIG. 23, the intermediate resin layer 24 may be formed so as to constitute a spacer that surrounds each light-emitting element 30.

Figure 24:
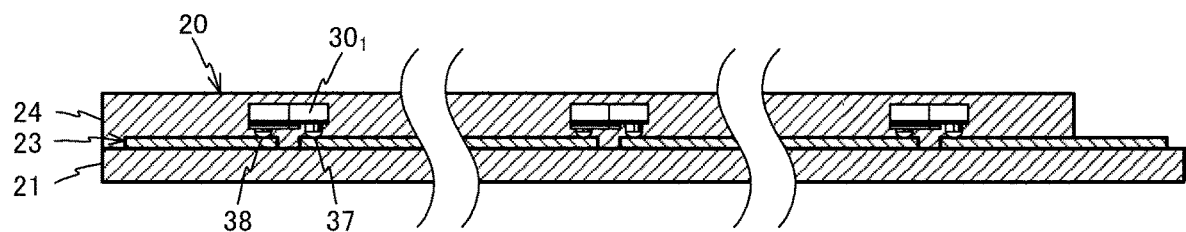
FIG. 24 shows an alternative example of the light-emitting panel.

In the above embodiments, the case in which the light-emitting panel 20 of the light-emitting device 10 includes the pair of boards 21, 22 and the intermediate resin layer 24 was explained. However, the present invention is not limited thereto, and as shown in FIG. 24, the light-emitting panel 20 may be configured from one board 21 and an intermediate resin layer 24 which holds the light-emitting elements 30.

Figure 25:
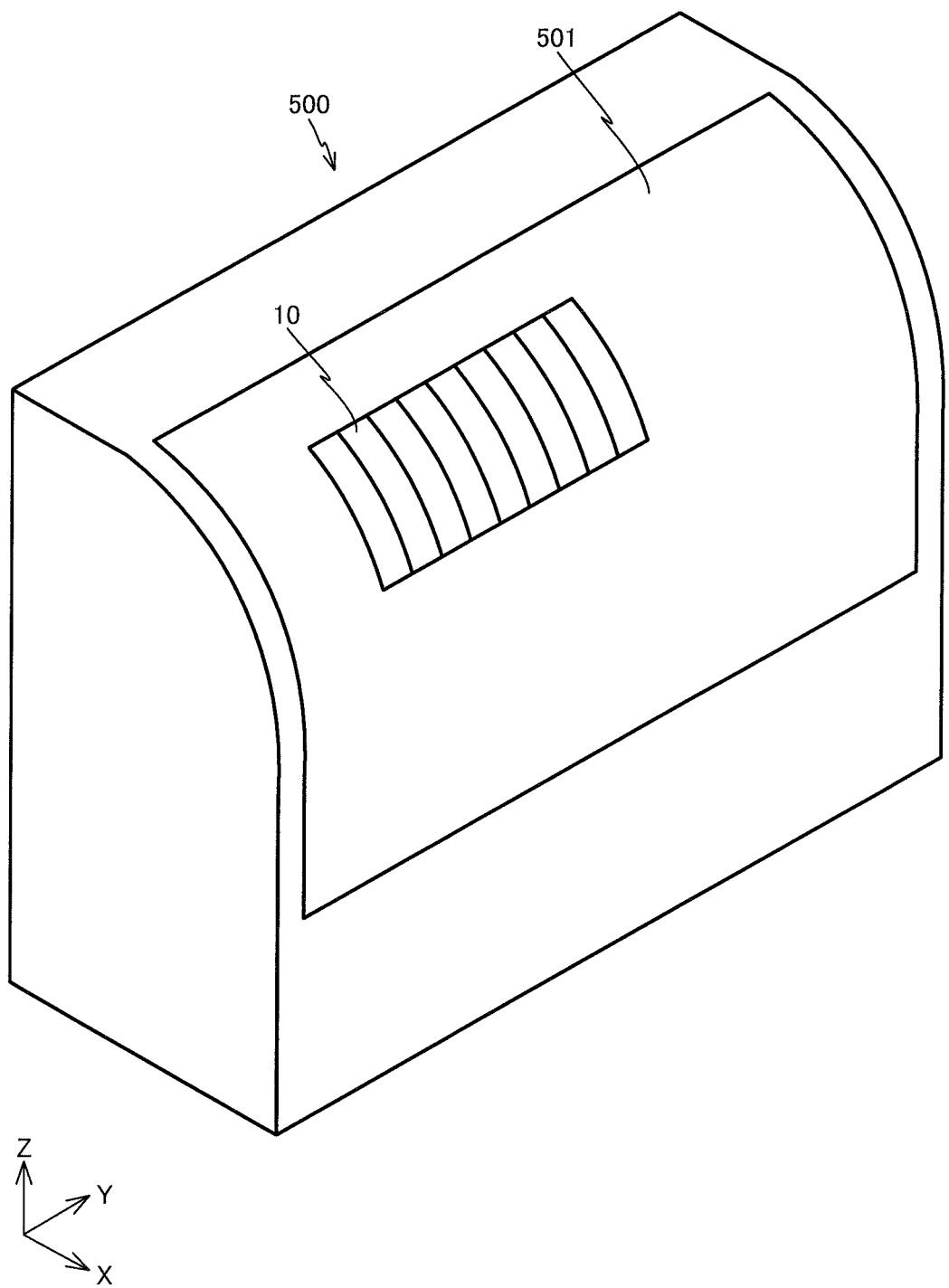
FIG. 25 shows a usage embodiment of the light-emitting device.

The light-emitting device 10 of the present embodiment is flexible. Therefore, for example, as shown in FIG. 25, the light-emitting device 10 can be used to decorate a showcase 500, etc. for exhibiting products via a curved surface glass 501. Even if the light-emitting device 10 is disposed on the curved surface glass 501, products can be exhibited through the light-emitting device 10. Therefore, for example, a message can be displayed using the light-emitting device 10 without inhibiting the exhibition of the products. By disposing a plurality of the light-emitting devices 10 in a line, a display can be created according to the size of the showcase 500. Such a use is not limited to a showcase or show window, and the light-emitting device 10 can be used as various decorations or messengers.

Figure 26:
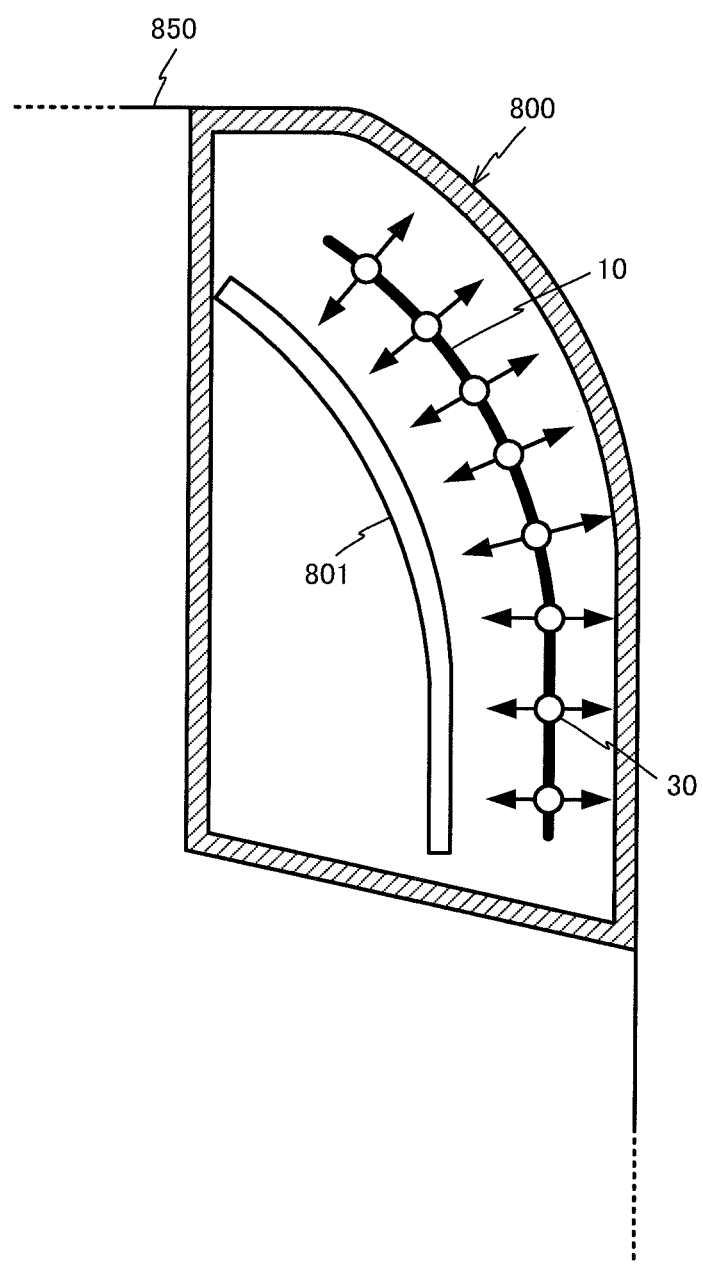
FIG. 26 shows a usage embodiment of the light-emitting device.

The light-emitting device 10 according to the present embodiment can be used in a tail lamp of a vehicle. By using the light-emitting device 10 which is translucent and flexible as a light source, various visual effects can be realized. FIG. 26 schematically illustrates a cross-section in the horizontal plane and the internal structure of a resin casing in a tail lamp 800 of a vehicle 850. The light-emitting device 10 is disposed along an inner wall surface of the resin casing of the tail lamp 800, and a mirror 801 is disposed on the back surface of the light-emitting device 10. Therefore, light emitted from the light-emitting device 10 toward the mirror 801 is reflected off the mirror 801 and then passes through the light-emitting device 10 so as to be emitted to the outside. Due to this configuration, a unit can be created in which there appears to be another light source besides the light-emitting device 10 in the depth direction of the tail lamp 800.

In the light-emitting device 10, there are cases in which the light-emitting panel and the flexible wiring board are not disposed on the same plane. In particular, when installed in a vehicle, there are many cases in which the light-emitting panel and the wiring/circuit portions are not disposed in the same plane. In such cases, it is necessary to consider that the connection portion of the light-emitting panel and the flexible wiring board may be pulled in different direction from the plane of the light-emitting panel, or that repeated bending stress may be applied to the connection portion between the light-emitting panel and the flexible wiring board. Further, if the light-emitting device is for installation in a vehicle, it is also necessary to consider that high temperature/high humidity conditions may be added at the same time as such stress. Therefore, it is necessary to evaluate high temperature/high humidity environments together with the stress addition. In order to ensure the reliability of the light-emitting device when installed in a vehicle, the light-emitting device should be able to withstand the application of a tensile stress of 16N, and withstand 1000 repeated bends (oscillations) at 4N, and operate normally even after 1000 hours in an environment where the temperature is 85° C. and the humidity is 85%.

<Technical Field>

Figure 27:
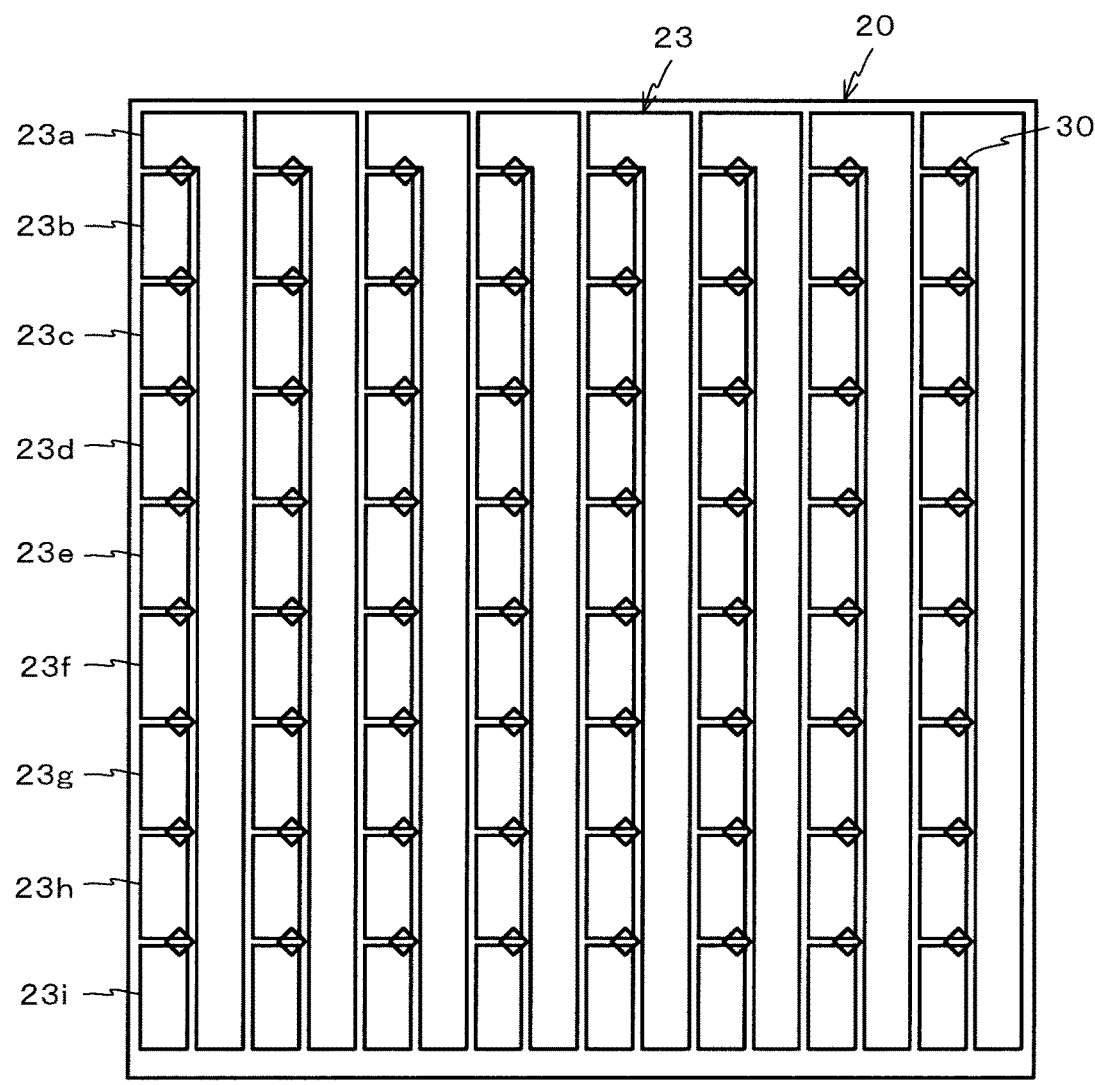
FIG. 27 shows an alternative example of the light-emitting panel.

In the light-emitting device 10 according to the above embodiments, the light-emitting elements 30 were arranged in a straight line as shown in FIG. 3. However, the present invention is not limited thereto, and the light-emitting elements 30 may be arranged in a matrix in a two-dimensional plane as shown in FIG. 27, and the arrangement of the light-emitting elements 30 is not particularly restricted.

Embodiments of the present invention were explained above, but the method for manufacturing the light-emitting device 10 is disclosed in detail in United States Patent Application, Publication No. US 2017/0250330 (WO 2016/047134). The light-emitting device in which the light-emitting elements are arranged in a matrix is disclosed in detail in Japanese Patent Application No. 2018-164963. The contents of these applications are incorporated herein by reference.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A light-emitting device comprising:
   a light-emitting panel comprising a first board that is light transmissive and flexible, a plurality of conductor patterns formed on a surface of the first board, a plurality of light-emitting elements connected to one of the conductor patterns, and a second board that is light transmissive and flexible and that holds the light-emitting elements relative to the first board; and
   a flexible wiring board comprising a circuit pattern that is electrically connected via an anisotropic conductive layer to an exposed part of the conductor patterns formed on the first board, the exposed part being exposed by the end of the second board,
   wherein a ratio of a minimum distance between a substrate of the flexible wiring board and the first board at a portion where the conductor patterns and the circuit pattern are not in electrical contact with each other via the anisotropic conductive layer relative to a distance between the substrate of the flexible wiring board and the first board at a portion where the conductor patterns and the circuit pattern are in electrical contact with each other via the anisotropic conductive layer is at least ¾ and no more than 9/10.

2. A light-emitting device comprising:
   a light-emitting panel comprising a first board that is light transmissive and flexible, a plurality of conductor patterns formed on a surface of the first board, a plurality of light-emitting elements connected to one of the conductor patterns, and a second board that is light transmissive and flexible and that holds the light-emitting elements relative to the first board; and
   a flexible wiring board comprising a circuit pattern that is electrically connected via an anisotropic conductive layer to an exposed part of the conductor patterns formed on the first board, the exposed part being exposed by the end of the second board,
   wherein a minimum interval between the conductor patterns and the circuit pattern at a point spaced apart in a direction along the first board by a distance which is 8 times the diameter of a conductive particle included in the anisotropic conductive layer from a contact point of the conductive particle which contacts both the circuit pattern and the conductor patterns in a region where the conductor patterns are in electrical contact with the circuit pattern via the anisotropic conductive layer is no more than ½ and at least 1/20 of the diameter of the conductive particle.

3. A light-emitting device comprising:
   a light-emitting panel comprising a first board that is light transmissive and flexible, a plurality of conductor patterns formed on a surface of the first board, a plurality of light-emitting elements connected to one of the conductor patterns, and a second board that is light transmissive and flexible and that holds the light-emitting elements relative to the first board; and
   a flexible wiring board comprising a circuit pattern that is electrically connected via an anisotropic conductive layer to an exposed part of the conductor patterns formed on the first board, the exposed part being exposed by the end of the second board,
   wherein a minimum interval between the conductor patterns and the circuit pattern at a point spaced apart in a direction along the first board by a distance which is 8 times the diameter of a conductive particle included in the anisotropic conductive layer from a contact point of the conductive particle which contacts both the circuit pattern and the conductor patterns in a region where the conductor patterns are in electrical contact with the circuit pattern via the anisotropic conductive layer is at least 0.2 µm and no more than 2.5 µm.

4. The light-emitting device according to claim 1, wherein an adhesive layer of the anisotropic conductive layer is made of a fluororesin.

5. The light-emitting device according to claim 1, wherein the conductive particle included in the anisotropic conductive layer is a resin spherical body covered in nickel and/or gold, or is a nickel particle.

6. The light-emitting device according to claim 1, wherein a connection portion with the flexible wiring board that has the circuit pattern and that is electrically connected via the anisotropic conductive layer to the exposed part of the conductor patterns formed on the first board is sealed by a protective tape and a mold resin.

7. The light-emitting device according to claim 1, wherein at an end of the flexible wiring board, an end of the circuit pattern is divided into a plurality of wires having a wire width that is narrower than a wire width of the plurality of conductor patterns, and an end of the conductor pattern of the light-emitting panel is electrically connected, at an end of the first board, via the anisotropic conductive layer to the ends of the circuit pattern of the flexible wiring board which is divided into the plurality of wires.

* * * * *